United States Patent
Murai et al.

(10) Patent No.: US 6,496,429 B2
(45) Date of Patent: Dec. 17, 2002

(54) SEMICONDUCTOR MEMORY DEVICE

(75) Inventors: Yasumitsu Murai, Hyogo (JP); Tetsushi Tanizaki, Hyogo (JP); Masaru Haraguchi, Hyogo (JP)

(73) Assignees: Mitsubishi Denki Kabushiki Kaisha, Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 09/988,173

(22) Filed: Nov. 19, 2001

(65) Prior Publication Data

US 2002/0131307 A1 Sep. 19, 2002

(30) Foreign Application Priority Data

Mar. 13, 2001 (JP) ......................................... 2001-070675

(51) Int. Cl.⁷ ................................................. G11C 7/00
(52) U.S. Cl. ........................................ 365/200; 365/201
(58) Field of Search ................................. 365/200, 201, 365/230.05, 189.03, 233

(56) References Cited

U.S. PATENT DOCUMENTS 5,327,382 A  7/1994  Seno et al. ................. 365/210
5,396,499 A  * 3/1995  Urai ........................... 371/21.1
5,808,948 A  * 9/1998  Kim et al. .................... 365/201
6,046,955 A  * 4/2000  Suematsu et al. ......... 365/230.03

FOREIGN PATENT DOCUMENTS

JP          7-29394         1/1995

OTHER PUBLICATIONS

U.S. patent application Ser. No. 09/754,123, Ohtani et al., filed Jan. 5, 2001.

* cited by examiner

Primary Examiner—Richard Elms
Assistant Examiner—Anh Phung
(74) Attorney, Agent, or Firm—McDermott, Will & Emery

(57) ABSTRACT

A spare data terminal for inputting/outputting spare memory cell data to the outside of a semiconductor memory device and a terminal for inputting/outputting normal memory cell data are provided separately from each other. In a test mode, the data terminals are coupled in parallel to internal data line pairs and, simultaneously, a spare data line pair is coupled to the spare data terminal. Thus, test time for detecting a defective bit in the semiconductor memory device can be shortened.

12 Claims, 18 Drawing Sheets

SEMICONDUCTOR MEMORY DEVICE

BACKGROUND OF THE INVENTION

1. Field of the Invention

The present invention relates to a semiconductor memory device and, more particularly, to a semiconductor memory device having a redundancy circuit for repairing a failure in normal memory cells by replacement. More particularly, the invention relates to a configuration for shortening a test time of a semiconductor memory device having a defect repaired by performing a replacement on an internal data line (IO line) basis.

2. Description of the Background Art

FIG. 18 is a diagram schematically showing the configuration of an array portion of a conventional semiconductor memory device. In FIG. 18, the semiconductor memory device includes a memory mat MM divided into a plurality of IO unit blocks IB0 to IBn along the row direction, a row/column decoder band RCB for selecting a memory cell in memory mat MM, and a data path DPH for transmitting/receiving data to/from the selected memory cell in memory mat MM. In each of IO unit blocks IB0 to IBn, memory cells of 32 bits are simultaneously selected at the time of column selection. For the memory cells (32IO) of 32 bits simultaneously selected, a spare memory array and a spare IO line pair SIO for repairing a defective memory cell column are provided. To the spare IO line pair, spare memory cells in the spare memory array are coupled. In each of the IO unit blocks IB0 to IBn, in defective column repairing, a defective column is repaired by replacing the corresponding internal data line pair (IO line pair) with the spare IO line pair.

In row/column decoder band RCB, a row decoder for selecting a row of memory cells in memory mat MM, and a column decoder for selecting a column of the memory cells in memory mat MM are aligned. As will be described in detail later, a word line for transmitting a row selection signal from the row decoder and a column selection line for transmitting a column selection signal from the column decoder are disposed in parallel with each other in the row direction.

Data path DPH includes a circuit for inputting/outputting data between the semiconductor memory device and an outside of the semiconductor, an input buffer and a write driver for writing data, a preamplifier and an output buffer for reading data, and a spare replacement circuit for replacing a defective column with an IO line pair to repair the defective column.

In the semiconductor memory device shown in FIG. 18, replacement with a spare IO line for repairing a defective column is executed on the IO unit block basis (IB0 to IBn). Specifically, in each of IO unit blocks IB0 to IBn, normal memory cells and spare memory cells for repairing a defective normal memory cell are disposed.

FIG. 19 is a diagram schematically showing the configuration of IO unit block IB0 illustrated in FIG. 18. Since IO unit blocks IB0 to IBn have the same configuration, in FIG. 19, IO unit block IB0 is representatively shown. In FIG. 19, IO unit block IB0 is divided into a plurality of row blocks RB#0 to RB#15 along the column direction. Each of row blocks RB#0 to RB#15 is divided into a plurality of unit memory arrays UMA along the row direction. By unit memory arrays UMA aligned in the column direction, a column block CB# is formed. In FIG. 19, each of row blocks RB#0 to RB#15 is divided into 33 unit memory arrays UMAs. As column blocks CB#, therefore, 32 column blocks CB#0 to CB#31 and a spare column block SCB#0 are disposed.

In correspondence with column blocks CB#0 to CB#31, internal data line pairs (global data line pairs) GIO0 to GIO31 are disposed, respectively. For spare column block SCB#0, a spare internal data line pair (spare global data line pair) SGIO0 is disposed. In unit memory array UMA, memory cells are arranged in rows and columns. A row block RB# is selected by the row decoder in the row/column decoder band, and column selection is performed on the unit memory array in the selected row block by the column decoder disposed for the selected row block.

Global data line pairs GIO0 to GIO31 and spare global data line pair SGIO0 are shared by the unit memory arrays UMA included in column blocks CB#0 to CB#31 and spare column block SCB#0, respectively. One row block is selected, column selection is performed in the selected row block, and data in the memory cells of 33 bits including a spare memory cell data is transferred. In a row block RB#, the normal and spare memory cells are simultaneously selected and coupled to global data line pairs GIO0 to GIO31 and spare global data line pair SGIO0.

FIG. 20 is a diagram showing the configuration of IO unit block IB0 more specifically. Each of the other IO unit blocks IB1 to IBn has a similar configuration. In FIG. 20, in IO unit block IB0, unit memory arrays UMA are arranged in 16 rows and 33 columns. Unit memory array UMA has memory cells arranged in 256 rows and 16 columns. In row blocks RB#0 to RB#15, spare word lines SWL0 to SWL15 are disposed, respectively. A defective memory cell row is repaired on a row block basis.

In row block RB#0, word lines WL0 to WL255 and spare word line SWL0 are disposed being shared by corresponding 33 unit memory arrays UMA. Column selection lines CSL0 to CSL15 are disposed being shared by 33 unit memory arrays UMA.

In row block RB#1, word lines WL256 to WL511 and spare word line SWL1 are disposed, and column selection lines CSL16 to CSL31 are disposed in the row direction.

In row block RB#15, word lines WL3840 to WL4095, spare word line SWL15, and column selection lines CSL240 to CSL255 are provided in the row direction and shared by unit memory arrays UMA in row block RB#15.

In each of row blocks RB#0 to RB#15, word lines, spare word line, and column selection lines CSL are provided being shared by corresponding unit memory arrays UMA. In memory cell selection, consequently, selection of memory cell row and column is executed also in spare column block SCB#0. In each of unit memory arrays UMA, according to a 1/16 decoding operation, one of 16 columns is selected and coupled to the corresponding global data line GIO (in GIO0 to GIO31). Simultaneously, in spare column block SB#0 as well, a spare memory cell column is selected and coupled to spare global data line pair SGIO0.

Spare column block SCB#0 is used to repair a defective column on the row block basis in IO unit block IB0 or replace a defective global data line pair GIO. Without waiting for a result of determination whether a defective column address is designated or not, normal memory cells and spare memory cells are simultaneously selected. After the spare determination, when a defective column address is designated, the corresponding defective global data line pair GIO is replaced by the spare global data line pair SGIO0. By performing a column selecting operation before the spare determination, time for accessing a column (writing/reading of data) is shortened.

FIG. 21 is a diagram schematically showing an example of the configuration of a unit memory array UMA. In FIG. 21, unit memory array UMA includes normal memory cells NMC disposed in plural rows and plural columns (256 rows and 16 columns) and spare memory cells SMC aligned in a row. Normal memory cells NMC and spare memory cells SMC are aligned in the column direction.

Word lines WL are disposed in correspondence with the rows of normal memory cells NMC. In unit memory array UMA, 256 word lines are disposed. In FIG. 21, word lines WL0 to WL255 are disposed. To each of normal word lines WL0 to WL255, memory cells in the corresponding row are connected. To spare word line SW0, spare memory cells SMC are coupled. Normal memory cells NMC and spare memory cell SMC are aligned in each column, and bit line pairs BLP0 to BLP15 are disposed in correspondence with the memory cell columns. Each of bit line pairs BLP0 to BLP15 consists of bit lines BL and ZBL (not shown). Corresponding to crossings between word lines WL and spare word line SWL0, and bit line BL or ZBL, memory cells NMC and SMC are disposed.

For bit line pairs BLP0 to BLP15, sense amplifiers SA0 to SA15 are disposed, respectively. When activated, sense amplifiers SA0 to SA15 differentially amplify potentials of corresponding ones of bit line pairs BLP0 to BLP15 and latch the amplified potential.

Sense amplifiers SA0 to SA15 are coupled to a global data line pair GIO via column selection gates CS0 to CS15 receiving column selection signals CSL0 to CSL15. Column selection signals CSL0 to CSL15 are commonly transmitted to unit memory arrays UMA included in corresponding row block RB# as shown in FIG. 20. In unit memory array UMA, one of column selection gates CG is made conductive in accordance with column selection signals CSL0 to CSL15, and corresponding bit line pair BLP (one of BLP0 to BLP15) is coupled to global data line pair GIO via sense amplifier SA (one of SA0 to SA15).

Therefore, the memory cells of 32 bits in IO unit block IB and a memory cell of one bit in the unit memory array in the spare column block are simultaneously selected. In one memory mat, memory cells of 32·(n+1) bits and memory cells of (n+1) bits in spare column block are simultaneously selected.

FIG. 22 is a diagram schematically showing an example of the configuration of a read data path for outputting data included in data path DPH illustrated in FIG. 18. FIG. 22 shows the configuration for output data Dout0 to Dout31 of 32 bits. The read data path shown in FIG. 22 is provided for each of IO unit blocks IB0 to IBn.

In FIG. 22, the read data path includes: preamplifiers PK0 to PK31 provided for global data line pairs GIO0 to GIO31, respectively, for ampliying memory cell data on global data line pairs GIO0 to GIO31 when activated; a spare preamplifier SPK provided for spare global data line pair SGIO, for amplifying memory cell data on spare global data line pair SGIO when activated; multiplexers MX0 to MX31 provided for preamplifiers PK0 to PK31, respectively, each for selecting either an output signal of corresponding one of preamplifiers PK0 to PK31 or an output signal of spare preamplifier SPK; latch circuits RLFK0 to RLFK31 provided for multiplexers MX0 to MX31, respectively, and each made conductive when clock signal CLK is at the L level, to pass an output signal of corresponding one of multiplexers MX0 to MX31; and latch circuits RLK0 to RLK31 provided in correspondence with latch circuits RLFK0 to RLFK31, respectively, and entering a through state when clock signal CLK is at the H level, to pass output signals of latch circuits RLFK0 to RLFK31, for outputting output data bits Dout0 to Dout31.

Latch circuits RLFK0 to RLFK31 enter a latching state when clock signal CLK goes high. On the other hand, latch circuits RLK0 to RLK31 enter a latching state when clock signal CLK goes low.

In order to set a selection path of multiplexers MX0 to MX31, the read data path includes: a spare determination circuit 500 for generating spare address signals SPADD1 to SPADD31 for designating a defective global data line pair to be replaced by spare global data line pair SGI; an OR circuit 502 for receiving a test mode spare control signal TMSPCC and a spare address signal SPADD0 and generating a spare selection signal SPSEL0 to multiplexer MX0; and an AND circuit 504 for receiving spare address signals SPADD1 to SPADD31 and a complementary test mode spare control signal ZTMSPCC, generating spare selection signals SPSEL1 to SPSEL31, and supplying the generated spare selection signals SPSEL1 to SPSEL31 to multiplexers MX0 to MX31, respectively.

Spare determination circuit 500 stores addresses each for specifying a global data line pair to be replaced on a row block basis, takes in a row block specifying address BLADD supplied when a row active command instructing row selection is applied. When a column access command R/W for instructing reading/writing of data is supplied, spare determination circuit 500 generates spare address signals SPADD1 to SPADD31 in accordance with row block specifying address BLADD. In the configuration of spare determining circuit 500, a unit memory array corresponding to a defective column or defective global data line pair is replaced by a unit memory array including a memory cell for repairing the defect, that is, a unit memory array in the spare column block.

When test mode spare control signal TMSPCC is at the H level, a mode of testing a spare memory cell is designated. In the following description, "spare memory cell" indicates a memory cell in the spare column block. When a spare memory cell connected to the spare word line is used in a column block other than the spare column block, the memory cell will be referred to as a normal memory cell.

In this state of spare test mode, spare selection signal SPSEL0 from OR circuit 502 is forcedly set to the H level in accordance with test mode spare control signal TMSPCC, and multiplexer MX0 selects an output signal of spare preamplifier SPK. At this time, complementary test mode spare control signal ZTMSPCC is at the L level, all spare selection signals SPSEL1 to SPSEL31 are at the L level, and multiplexers MX1 to MX31 select output signals of corresponding preamplifiers PK1 to PK31.

On the other hand, when test mode spare control signal TMSPCC is at the L level, complementary test mode spare control signal ZTMSPCC is at the H level, and spare selection signals SPSEL0 to SPSEL31 are generated according to spare address signals SPADD0 to SPADD31. When a defective bit exists, in any of multiplexers MX0 to MX31, the corresponding global data line pair is replaced by the spare global data line pair. When no defective bit exits, all spare addresses SPADD0 to SPADD31 are at the L level, and multiplexers MX0 to MX31 select output signals of preamplifiers PK0 to PK31.

FIG. 23 is a diagram schematically showing an example of the configuration of a write data path for writing data in the data path illustrated in FIG. 18. FIG. 23 also shows the configuration for one IO unit block. In FIG. 23, the write data path includes: latch circuits WLFK0 to WLFK31 for latching externally applied write data bits Din0 to Din31 synchronously with clock signal CLK; a multiplexer MUX for selecting one of output signals of latch circuits WLFK0 to WLFK31 in accordance with spare address signals SPADD0 to SPADD31; latch circuits WLK0 to WLK31 for taking in and latching output signals of latch circuits WLFK0 to WLFK31 synchronously with clock signal CLK; a spare latch circuit SWLK for latching an output signal of multiplexer MUX; write drivers WDK0 to WDK31 provided in correspondence with latch circuits WLK0 to WLK31, respectively, for driving global data line pairs GIO0 to GIO31 in accordance with output signals of latch circuits WLK0 to WLK31 to generate internal write data when activated; and a spare write driver SWDK for driving spare global data line pair SGIO0 in accordance with an output signal of spare latch circuit SWLK when activated.

Latch circuits WLFK0 to WLFK31 enter a through state when clock signal CLK goes low, and enter a latch state when clock signal CLK goes high. Latch circuits WLK0 to WLK31 and SWLK enter a through state when clock signal CLK goes high, and enter a latch state when clock signal CLK goes low.

Multiplexer MUX further receives test mode spare control signal TMSPCC and selects and supplies an output signal of latch circuit WLFK0 to latch circuit SWLK in writing data to a spare memory cell,. Spare write driver SWDK is activated when a spare is hit (when a defective bit is accessed), and drives a spare global data line pair SGIO0 in accordance with an output signal of spare latch circuit SWLK.

FIG. 24 is a diagram showing an example of the configuration of multiplexer MUX illustrated in FIG. 23. In FIG. 24, multiplexer MUX includes: an OR circuit 506 for receiving test mode spare control signal ATMSPCC and spare address SPADD0; a selection circuit SX0 for passing internal data Data0 from a corresponding latch circuit (WLFK0) when an output signal of OR circuit 506 is at the H level; and selection circuits SX1 to SX31 provided in correspondence with latch circuits WLFK1 to WLFK31, respectively, and made conductive when corresponding spare address signals SPADD1 to SPADD31 are at the H level to pass internal data bits Data1 to Data31 from the corresponding latch circuits.

Selection circuits SX0 to SX31 have the same configuration and each include an inverter IV for receiving an output signal of OR circuit 506 or a transfer control signal being a spare address, and a transmission gate TM selectively made conductive according to the transfer control signal and an output signal of inverter IV to pass a corresponding internal data bit Data. An output signal of OR circuit 506 is supplied as a transfer control signal to selection circuit SX0, and spare address signals SPADD1 to SPADD31 are supplied as transfer control signals to selection circuits SX1 to SX31, respectively.

In the configuration of the multiplexer shown in FIG. 24, when test mode spare control signal TMSPCC is at the L level, OR circuit 506 operates as a buffer circuit. Therefore, according to spare address signals SPADD0 to SPADD31, internal data bits Data0 to Data31 from latch circuits WLFK0 to WLFK31 shown in FIG. 23 are selectively passed, and an output signal Out is generated and supplied to spare latch circuit SWLK (refer to FIG. 23). When no defective bit exits, all spare address signals SPADD0 to SPADD31 are at the L level, and all selection circuits SX0 to SX31 enter an output high impedance state, so that internal write data is not transmitted to spare global data line pair SGIO. When a defective bit exits, a corresponding spare address SPADDi goes high, a corresponding selection circuit SXi is made conductive, internal data bit Datai from a corresponding latch circuit WLFKi is selected, and the output signal Out is generated and supplied to spare latch circuit SWLK.

When test mode spare control signal TMSPCC is at the H level, irrespective of a logic level of spare address signal SPADD0, an output signal of OR circuit 506 goes high, an internal data bit Data0 from latch circuit WLFK0 shown in FIG. 23 is selected, and output signal Out is generated and supplied to spare latch circuit SWLK. When test mode spare control signal TMSPCC is at the H level, data can be written into a spare memory cell in accordance with write data bit Din0 from an outside of the device. By using test mode spare control signal TMSPCC, whether normal memory cell and spare memory cell are normal or not can be determined with respect to all bits, and a defective normal memory cell can be repaired by using a normal spare memory cell. In this description, the normal memory cell indicates a memory cell coupled to global data line pair GIO, and the spare memory cell indicates a memory cell coupled to the spare global data line pair. In the following description as well, similar definition of memory cells will be used.

In a semiconductor memory device having a redundant bit, in order to replace a defective normal memory cell by a spare memory cell, a test as described below is performed. First, test mode spare control signal TMSPCC is set to the L level. Since the defect address designating a defective normal memory cell is not programmed yet, all spare address signals SPADD0 to SADD0-31 are at the L level. In this state, a test is performed on all bits of the normal memory cells. Subsequently, test mode spare control signal TMSPCC is set to the H level and a test is performed on all bits of the spare memory cells. Specifically, by selection circuit SX0 and multiplexer MX0, the spare global data line pair is selected in place of global data line pair GIO0 to make the spare global data line pair to be accessed from the outside of the device, thereby writing and reading data to and from the spare memory cell.

In the case where it is found, from the test performed on all the memory cells of normal and spare memory cells, that a defective normal memory cell exists, when the spare memory cell for replacing the defective memory cell is not defective, the defective normal memory cell is replaced by the spare memory cell (that is, the defect address is programmed in the spare determining circuit). In the replacement by the spare memory cell, in the above-described configuration, redundancy replacement is performed on a global data line pair GIO basis. Redundancy replacement for repairing a defect may be performed on a column selection line unit. As shown in FIG. 19, spare word line SWL is used, and defect repairing is executed on a word line by word line basis. In the redundancy replacement, therefore, a predetermined number of normal memory cells related to the defective normal memory cell are simultaneously replaced with the spare memory cells for repairing defect.

In the case of the configuration of performing spare replacement on a global data line pair unit, based on defect address information programmed by blowing a fuse element or the like in the spare determining circuit shown in FIG. 22, whether redundancy replacement is performed or not is determined. When an address of a memory cell to be replaced is input, write data bits input to the normal global data line pair to be replaced are transmitted to the spare global data line pair (in data writing mode). In data reading mode, the data bits of the normal global data line pair to be replaced are replaced with read data bits output from the spare global data line pair, and the defective normal memory cell and normal memory cells related to the defective normal memory cell are replaced by the spare memory cells. Equivalently, the global data line pair is replaced by the spare global data line pair.

In order to perform the repair by redundancy replacement of a defective normal memory cell, as described above, all the normal and spare memory cells have to be tested. For this purpose, test mode spare control signal TMSPCC is used. In the memory array, however, although the spare and normal memory cells are simultaneously selected in column selection, after performing the test on the normal memory cells, a test is performed on only the spare memory cells. Consequently, test mode spare control signal TMSPCC has to be switched. For the switch of the test mode, a test mode sequence requiring a predetermined time is necessary.

Specifically, for example, in order to switch the test mode for the normal memory cells to that for the spare memory cells, first, whether the test on all bits of the normal memory cells has been completed or not is determined, and after that, the test on the normal memory cells is completed. After completion of the test on the normal memory cells, a test mode for the spare memory cells is newly set, row and column addresses of the spare memory cell are generated, and a test is performed on the spare memory cells. Therefore, a certain time is required to switch the test mode, and a problem that the long test time for detecting a defective bit is necessary occurs.

Since the different tests for the normal and spare memory cells are performed in different modes, there is a problem that the test time is long. Particularly, in the case of using the unit memory array having the same configuration as that having the normal memory cells is used as a spare memory array, the number of bits of the spare memory cells increases, so that the test time on the spare memory cells increases.

SUMMARY OF THE INVENTION

An object of the invention is to provide a semiconductor memory device capable of efficiently performing a test on a memory cell.

Another object of the invention is to provide a semiconductor memory device having shortened test time for repairing an defective bit.

Further object of the invention is to provide a logic merged memory in which a logic and a memory are formed on the same chip, capable of efficiently performing a test for repairing an defective bit in a short time.

Further another object of the invention is to provide a semiconductor memory device of a type of repairing an defective bit by IO replacement, capable of performing a test for repairing an defective bit in a short time.

A semiconductor memory device according to the invention includes a normal array having normal memory cells arranged in a matrix of rows and columns, and a spare array having spare memory cells arranged in a matrix of rows and columns, for repairing a defective cell in the normal memory cells by replacement. The normal array is divided into column blocks in unit of a predetermined number of columns.

The semiconductor memory device according to the invention further includes: a plurality of normal internal data lines disposed in correspondence with the column blocks and each coupled to a selected column of a corresponding column block; a spare internal data line disposed in correspondence with the spare array and to be coupled to a selected column of the spare array; a plurality of normal data terminals for receiving external data, disposed in correspondence with the plurality of normal internal data lines; a spare data terminal for receiving external data, disposed in correspondence with the spare internal data line; and a test control circuit for electrically coupling the plurality of normal data terminals and the plurality of normal internal data lines and for electrically coupling the spare internal data line and the spare data terminal in response to a test mode instruction signal.

According to another aspect of the invention, in a semiconductor memory device for repairing a defect in a unit of an IO line disposed commonly to memory cells in a plurality of columns and coupled to a selected column, a data terminal dedicated to spare data is provided separately from a normal data terminal, and a spare IO line and a spare data terminal are coupled to each other in a test mode, so that a normal memory cell and a spare memory cell can be accessed in parallel from an outside of the device.

By providing the spare data terminal for inputting and outputting spare data, the normal and spare memory cells can be accessed in parallel, and a test can be performed simultaneously on the normal and spare memory cells. Consequently, it is unnecessary to perform tests by separate sequences for the spare memory cell and for the normal memory cells. The time for switching the sequences also becomes unnecessary. Since the spare and normal memory cells are simultaneously tested in one test sequence, the time for the test on memory cells to repair a defective bit can be greatly reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
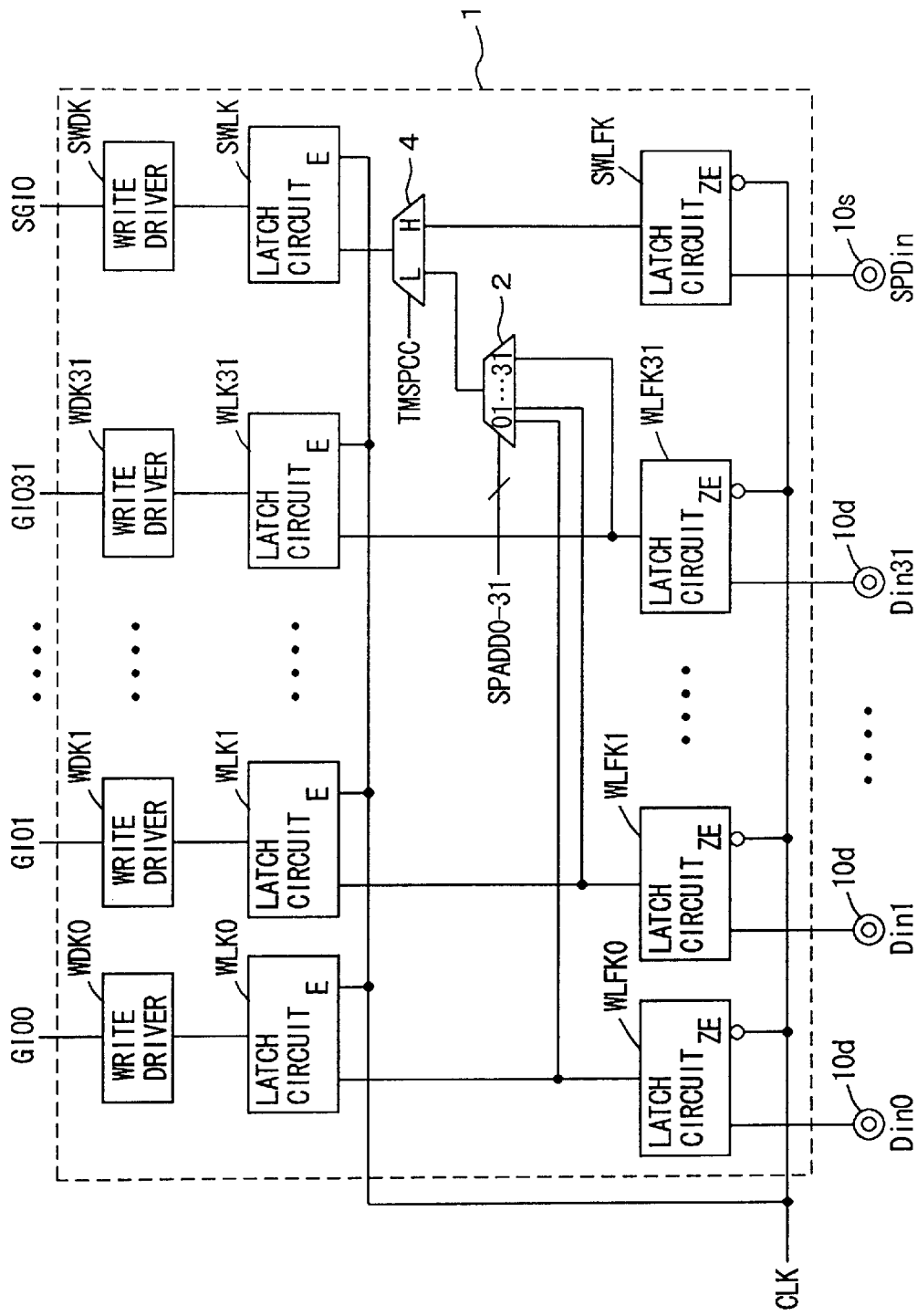
FIG. 1 is a diagram schematically showing the configuration of a write data path according to a first embodiment of the invention.
Figure 23:
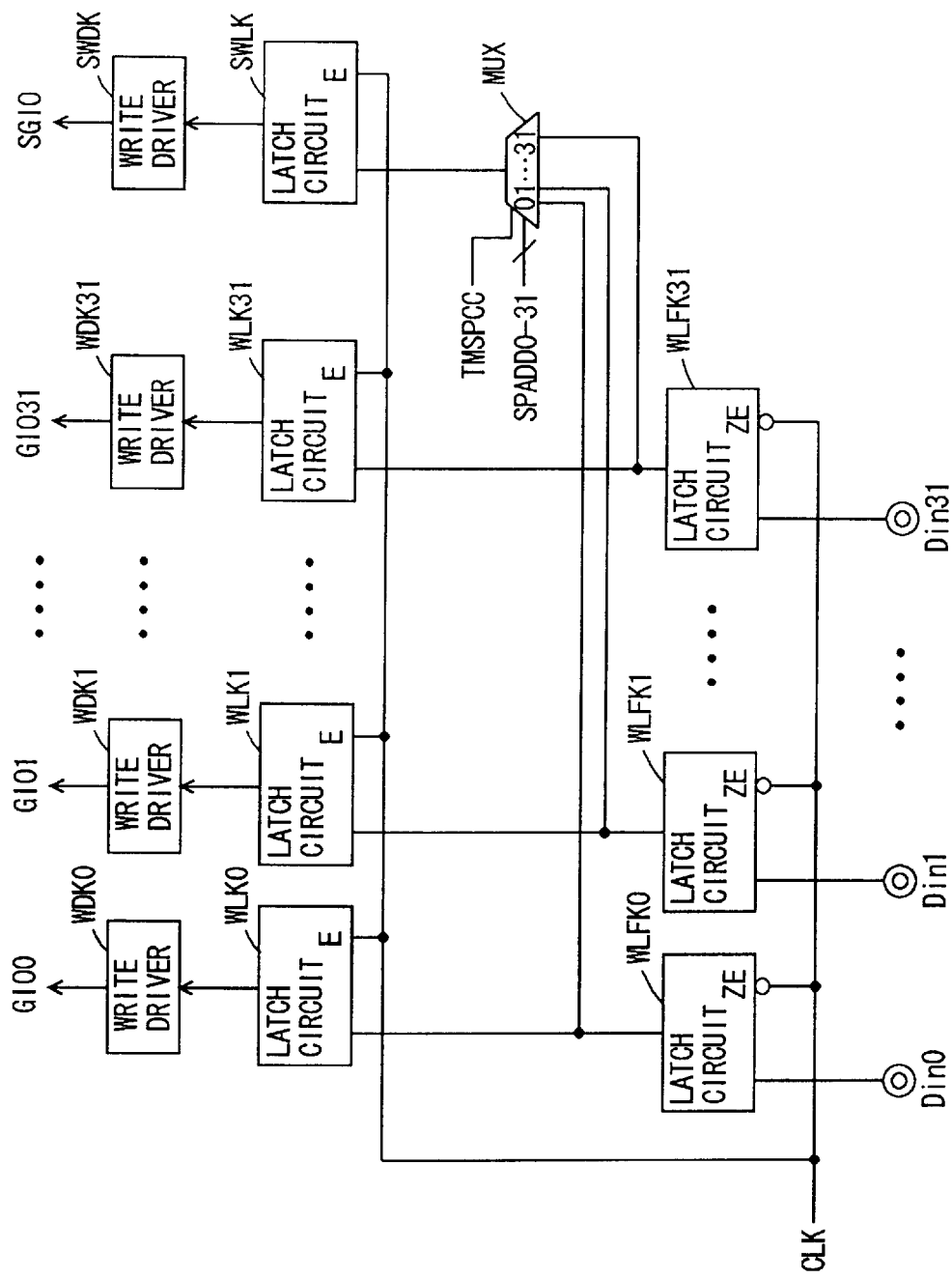
FIG. 23 is a diagram schematically showing the configuration of a write data path of the conventional logic merged DRAM chip.
Figure 24:
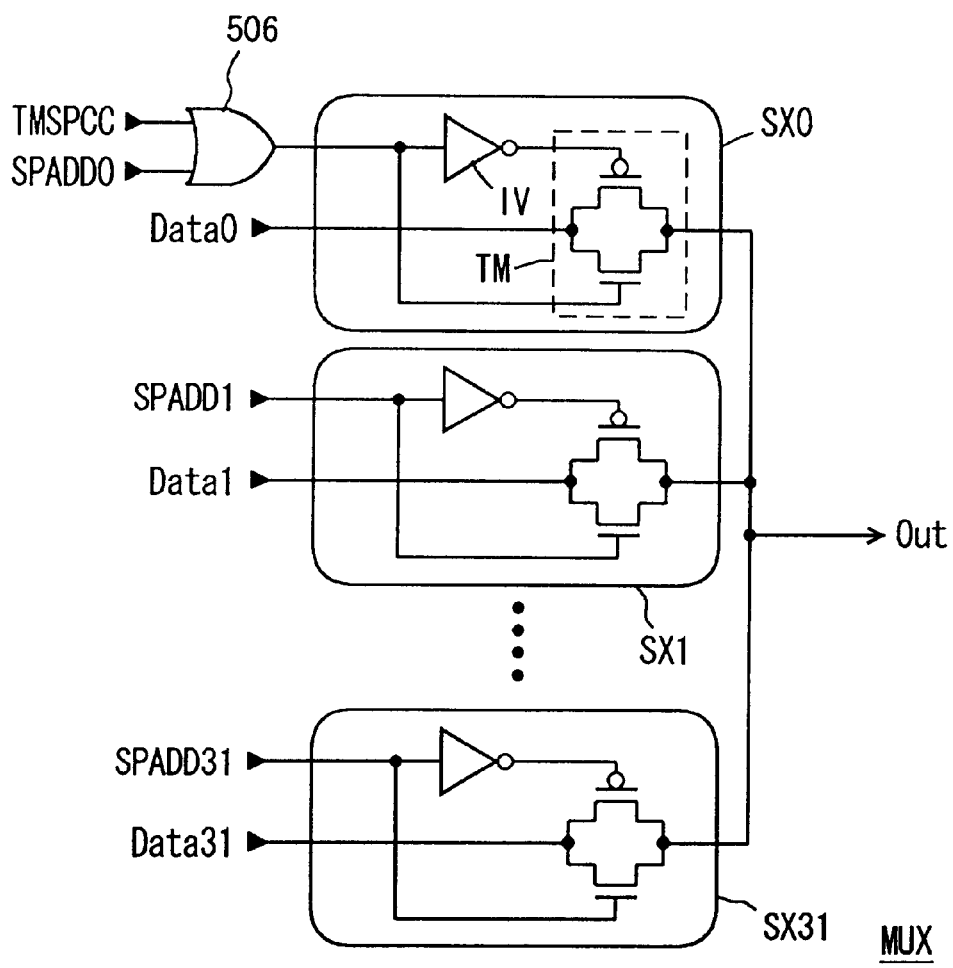
FIG. 24 is a diagram showing an example of the configuration of a multiplexer illustrated in FIG. 23.

FIG. 1 is a diagram schematically showing the configuration of a write data path of a semiconductor memory device according to the first embodiment of the invention. In a write data path 1 shown in FIG. 1, in addition to the configuration of the conventional write data path shown in FIG. 23, spare data input terminals 10 for inputting spare data bits are provided. Since the semiconductor memory device is an embedded memory and data is not directly input/output from/to the outside of the chip, the term "terminal" of "data input terminal" has the meaning equivalent to "pad" or "node" here. The configuration of the memory array unit is similar to that shown in FIGS. 18 to 21, and redundancy replacement for defect repairing is performed in a global data line unit.

For data input terminals 10d for receiving write data bits Din0 to Din31, in a manner similar to the conventional art, latch circuits WLFK0 to WLFK31 which enter a through state when a clock signal CLK goes low and enter a latch state when clock signal CLK goes high are provided. For a spare data input terminal 10s as well, a spare latch circuit SWLFK which enters the latch state when clock signal CLK goes high and enters the through state when clock signal CLK goes low is provided.

For latch circuits WLFKK0 to WLFK31, a multiplexer 2 for selecting output signals of latch circuits WLFK0 to WLFK31 in accordance with spare addresses SPADD0 to SPADD31 is provided. Multiplexer 2 performs 32:1 selecting operation to select one of latch circuits WLFK0 to WLFK31 in accordance with spare address signals SPADD0 to SPADD31. Test mode spare control signal TMSPCC is not supplied to multiplexer 2. Multiplexer 2 performs the selecting operation in accordance with spare address signals SPADD0 to SPADD31.

In order to write data into a spare memory cell, further, a multiplexer 4 for selecting either an output signal of multiplexer 2 or an output signal of latch circuit SWLFK in accordance with test mode spare control signal TMSPCC is provided. An output signal of multiplexer 4 is supplied to latch circuit SWLFK provided in correspondence with spare global data line pair SGIO. For latch circuits WLFK0 to WLFK31, in a manner similar to the conventional art, latch circuits WLK0 to WLK31 which enter the latch state in response to the falling edge of clock signal CLK are provided, respectively. Output signals of latch circuits WLK0 to WLK31 and SWLK are transmitted as write data bits to global data line pairs GIO0 to GIO31 and spare global data line SGIO via write drivers WDK0 to WDK31 and spare write driver SWDK, respectively.

Multiplexer 4 performs a 2:1 selecting operation to select either an input data bit from one of latch circuits WLFK0 to WLFK31 selected by multiplexer 2 or a spare write data bit supplied from latch circuit SWLFK. When test mode spare control signal TMSPCC is set to the H level, multiplexer 4 selects an output signal of latch circuit SWLFK. In this state, write data bits Din0 to Din31 supplied to data input terminals 10d are transmitted via latch circuits WLFK0 to WLFK31 and, simultaneously, a spare write data bit SPDin supplied via spare data input terminal 10s can be transmitted via latch circuit SWLFK and multiplexer 4. Test data can be therefore written simultaneously to the spare and normal memory cells.

When test mode spare control signal TMSPCC is at the L level, multiplexer 4 selects a data bit from multiplexer 2. In this state, according to the spare address, redundancy replacement is performed, and a global data line pair to be replaced is replaced by the spare global data line pair.

Figure 2:
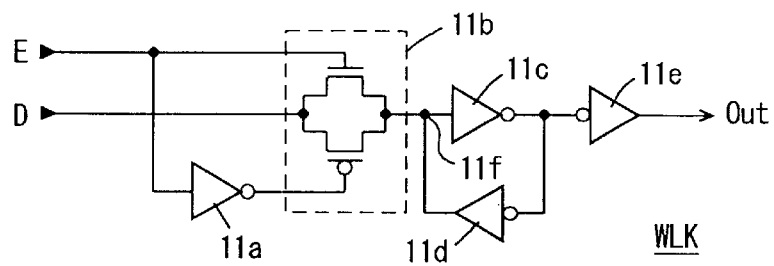
FIG. 2 is a diagram showing an example of the configuration of a latch circuit illustrated in FIG. 1.

FIG. 2 is a diagram showing an example of the configuration of latch circuits WLK0 to WLK31 and SWLK illustrated in FIG. 1. Since latch circuits WLK0 to WLK31 and SWLK have the same configuration, in FIG. 2, the configuration of one of latch circuits WLK is representatively shown. In FIG. 2, latch circuit WLK includes: an inverter 11a for inverting a signal supplied to a clock input node E; a CMOS transmission gate 11b for transmitting data supplied to a data input node D to an internal node 11f in response to the signal of clock input node E and an output signal of inverter 11a ; an inverter 11c for inverting a signal of internal node 11f; an inverter 11d for inverting an output signal of inverter 11c and transmitting the inverted signal to internal node 11f; and an inverter 11e for inverting an output signal of inverter 11c to generate an output signal (data bit) Out.

In latch circuit WLK illustrated in FIG. 2, when the signal supplied to clock input node E is at the H level, CMOS transmission gate 11b is made conductive to transmit the signal supplied to data input node D to internal node 11f. On the other hand, when the clock signal supplied to clock input node E is at the L level, CMOS transmission gate 11b becomes non-conductive, output signal Out is latched by inverters 11c and 11d and the latching state is maintained. Clock signal CLK is supplied to clock input node E. Latch circuit WLK enters the through state of taking in and outputting a signal supplied to data input node D when clock signal CLK illustrated in FIG. 1 is at the H level, and enters the latch state of isolating the data input node and output node when clock signal CLK goes low.

Figure 3:
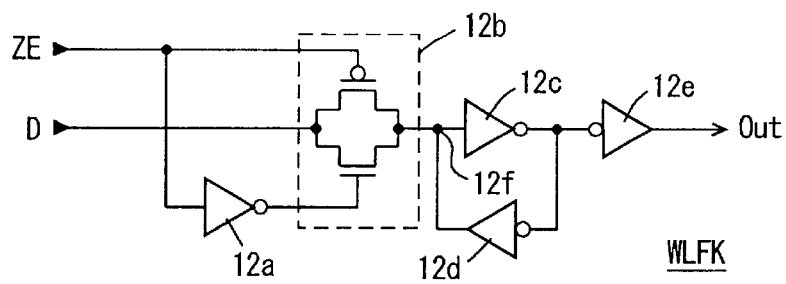
FIG. 3 is a diagram showing an example of the configuration of another latch circuit illustrated in FIG. 1.

FIG. 3 is a diagram showing an example of the configuration of latch circuits WLFK0 to WLFK31 and SWLFK at the input stage illustrated in FIG. 1. Since latch circuits WLFK0 to WLFK31 and SWLFK have the same configuration, in FIG. 3, the configuration of a latch circuit WLFK is representatively shown. In FIG. 3, latch circuit WLFK includes: an inverter 12a for inverting a signal at a clock input node ZE; a CMOS transmission gate 12b for transmitting a signal at data input node D in accordance with an output signal of clock input node ZE and an output signal of an inverter 12a; an inverter 12c for inverting a signal of internal node 12f; an inverter 12d for inverting an output signal of inverter 12c and transmitting an inverted signal to internal node 12f; and an inverter 12e for inverting an output signal of inverter 12c to generate an output signal (data bit) Out. Clock signal CLK is supplied to clock input node ZE, and a signal at a corresponding data input terminal is supplied to the data input node.

In latch circuit WLFK shown in FIG. 3, when the clock signal supplied to clock input node ZE is at the L level, CMOS transmission gate 12b is made conductive to transmit a signal supplied to data input node D to internal node 12f. In this case, output signal Out attains at a logic level corresponding to the signal on internal node 12f in accordance with inverters 12c and 12e. When the signal at clock input node ZE goes high, CMOS transmission gate 12b enters a non-conductive state, latch circuit WLFK enters the latch state to isolate the data input node and output node from each other, and a state that output signal Out is latched by inverters 12c and 12f is attained.

By using latch circuits WLK and WLFK shown in FIGS. 2 and 3, data bits Din0 to Din31 and SPDin supplied from the outside of the device are taken in response to the falling edge of clock signal CLK illustrated in FIG. 1. When clock signal CLK goes high, data bits Din0 to Din31 and SPDin are latched, and latch circuits WLK0 to WLK31 and SWLK are set to the through state to transmit write data bits to write drivers WDK0 to SWDK, and the global data line pairs and spare global data line pair are driven in accordance with the write data bits to write data into corresponding memory cells.

Figure 4:
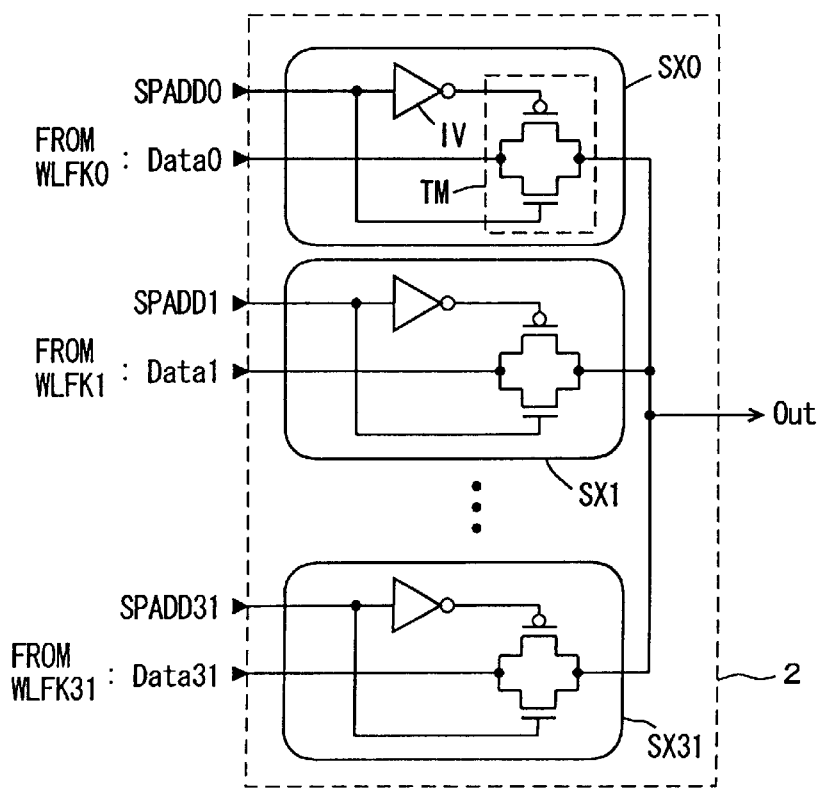
FIG. 4 is a diagram showing an example of the configuration of a multiplexer for 32:1 selection illustrated in FIG. 1.

FIG. 4 is a diagram showing an example of the configuration of multiplexer 2 for performing the 32:1 selecting operation illustrated in FIG. 1. In FIG. 4, multiplexer 2 includes selection circuits SX0 to SX31 provided in correspondence with latch circuits WLFK0 to WLFK31, respectively. Since selection circuits SX0 to SX31 have the same configuration, in FIG. 4, reference numerals of components of only selection circuit SX0 are shown. Each of selection circuits SX0 to SX31 includes: an inverter IV for inverting a corresponding spare address signal SPADDi (i=0 to 31); and a CMOS transmission gate TM for passing an output data bit Datai from the corresponding latch circuit WLFKi in accordance with corresponding spare address signal SPADDi and an output signal of inverter IV. Output nodes of selection circuits SX0 to SX31 are commonly coupled to the output node of multiplexer 2.

To multiplexer 2 shown in FIG. 4, test mode spare control signal TMSPCC is not applied. Data bits Data<31:0> from latch circuits WLFK0 to WLFK31 are selectively transmitted in accordance with a spare address SPADD<31:0>. Therefore, regardless of the test mode operation and the other normal mode operations, according to spare address SPADD<31:0>, when no defective bit exists, a data bit from the latch circuit corresponding to the defective global data line pair is selected by multiplexer 2.

Figure 5:
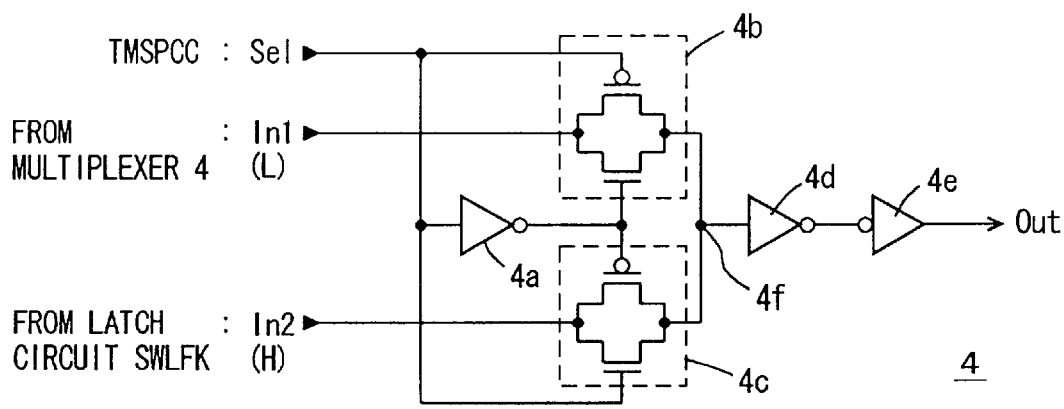
FIG. 5 is a diagram schematically showing the configuration of a multiplexer for 2:1 selection illustrated in FIG. 1.

FIG. 5 is a diagram showing an example of the configuration of multiplexer 4 for performing the 2:1 selecting operation illustrated in FIG. 1. In FIG. 5, multiplexer 4 includes: an inverter 4a for inverting test mode spare control signal TMSPCC supplied to a selection input Sel; a CMOS transmission gate 4b that is made conductive according to an output signal of inverter 4a and a signal on selection input Sel to transmit the signal on a first input node In1 to an internal node 4f; a CMOS transmission gate 4c that is made conductive complementarily with CMOS transmission gate 4b in response to an output signal of inverter 4a and the signal on selection input Sel to transmit the signal on a second input node In2 to internal node 4f; an inverter 4b for inverting a signal of internal node 4f; and an inverter 4e for inverting an output signal of an inverter 4d to generate the output signal Out. Output signal Out of multiplexer 4 is supplied to spare latch circuit SWLK illustrated in FIG. 1.

To multiplexer 4 shown in FIG. 5, test mode spare control signal TMSPCC is applied to selection input Sel, an output data bit from multiplexer 2 shown in FIG. 1 is applied to first input node In1, and an output bit of spare latch circuit SWLFK is applied to second input node In2. When test mode spare control signal TMSPCC is at the L level, CMOS transmission gate 4b is made conductive, CMOS transmission gate 4c is made non-conductive, and a data bit supplied from one of latch circuits WLFK0 to WLFK31 via multiplexer 4 to first input node In1 is selected and outputted as an output signal Out. On the other hand, when test mode spare control signal TMSPCC is set to the H level, CMOS transmission gate 4b is made non-conductive, CMOS transmission gate 4c is made conductive, and an output signal (spare write data bit) from latch circuit SWLFK supplied to second input node In2 is selected and outputted as an output signal Out.

Figure 6A:
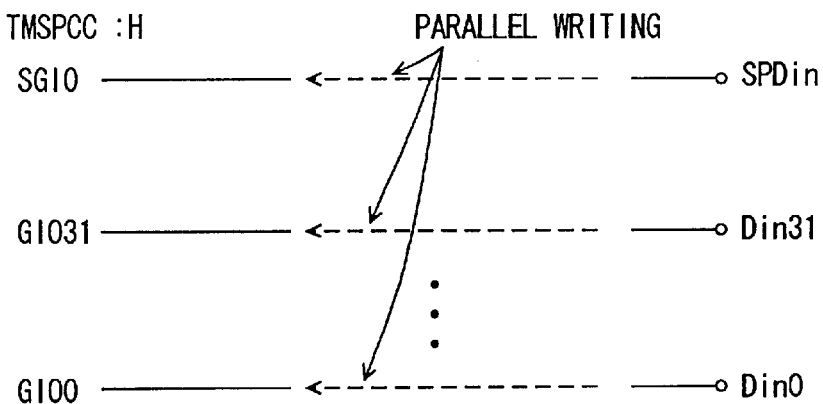
FIGS. 6A and 6B are diagrams schematically showing the coupling relation between internal data lines of the write data path and data input terminals.

By setting test mode spare control signal TMSPCC to the H level, therefore, spare latch circuit SWLFK can be selected to write spare write data to a spare memory cell via latch circuit SWLK and write driver SWDK at the next stage. Concurrently, write data bits Din0 to Din31 are also transmitted to global data line pairs GIO0 to GIO31 via latch circuits WLK0 to VVLK31 and write drivers WDK0 to WDK31, respectively. As shown in FIG. 6A, therefore, by setting test mode spare control signal TMSPCC to the H level, test data can be simultaneously written into both the normal and spare memory cells.

Figure 6B:
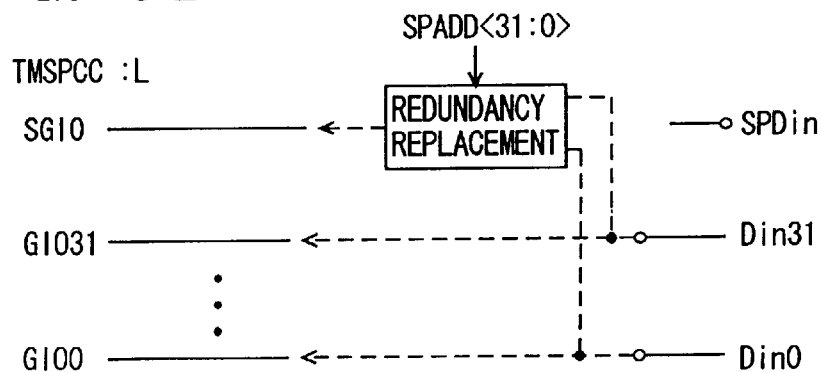

On the other hand, by setting test mode spare control signal TMSPCC to the L level, multiplexer 4 selects the data bit from multiplexer 2. Consequently, as shown in FIG. 6B, when a defective bit exists, redundancy replacement for repairing the defective bit is performed according to a spare address so that data can be written to the spare memory cell in place of the defective normal memory cell. In such a manner, the defective bit can be repaired.

In the write data path, therefore, by providing the spare data input terminal 10s for receiving spare write data to transmit spare write data SPDin of spare terminal data input terminal 10s to spare global data line pair SGIO when test mode spare control signal TMSPCC at the H level, it becomes unnecessary to write spare data into a spare memory cell by using the latch circuit for writing data to a specific normal memory cell. Consequently, time required to write test data to the normal and spare memory cells is greatly shortened, and the test sequence is simplified.

Figure 19:
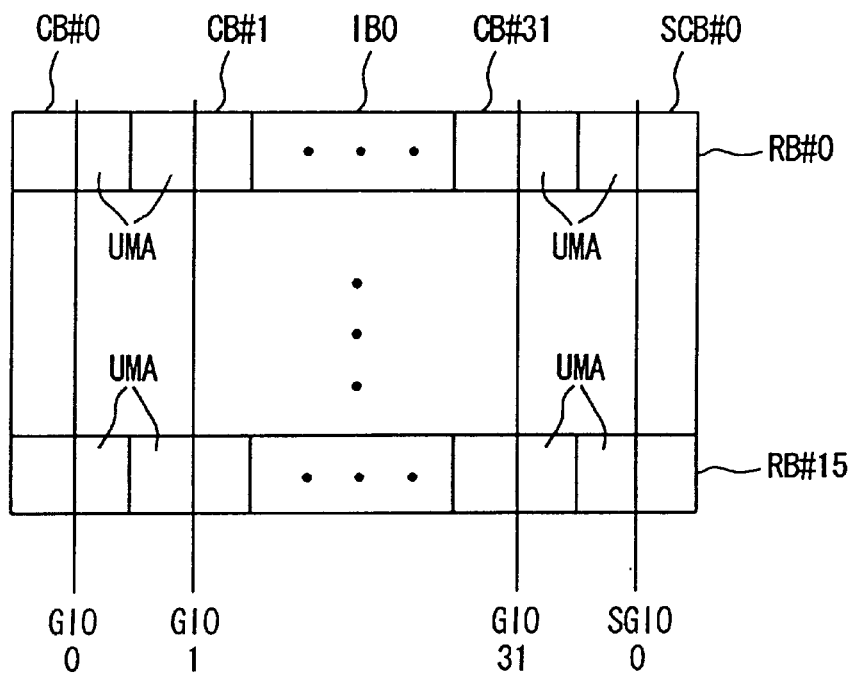
FIG. 19 is a diagram schematically showing the configuration of a memory mat illustrated in FIG. 18.
Figure 20:
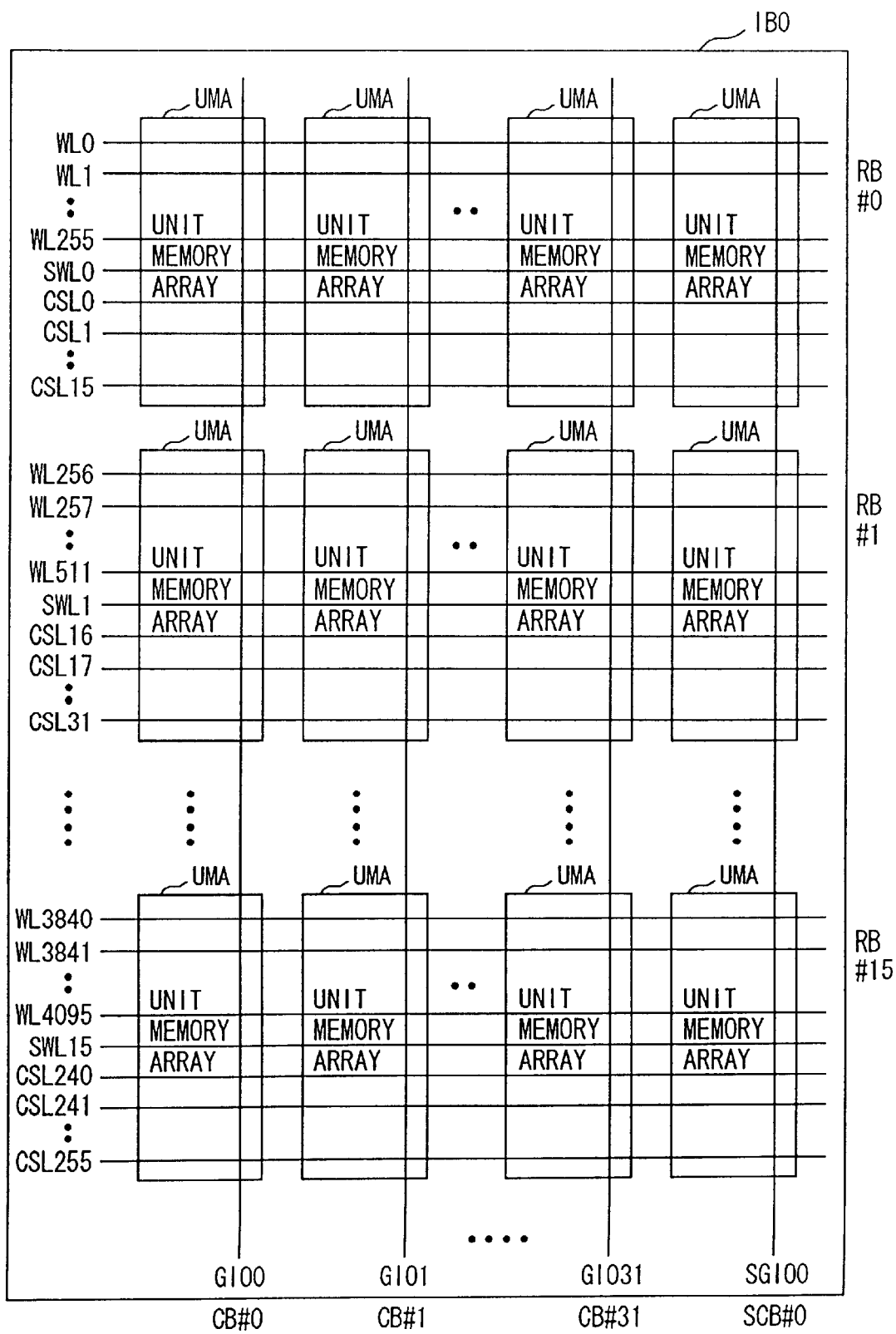
FIG. 20 is a diagram schematically showing the configuration of an IO unit block illustrated in FIG. 18.
Figure 21:
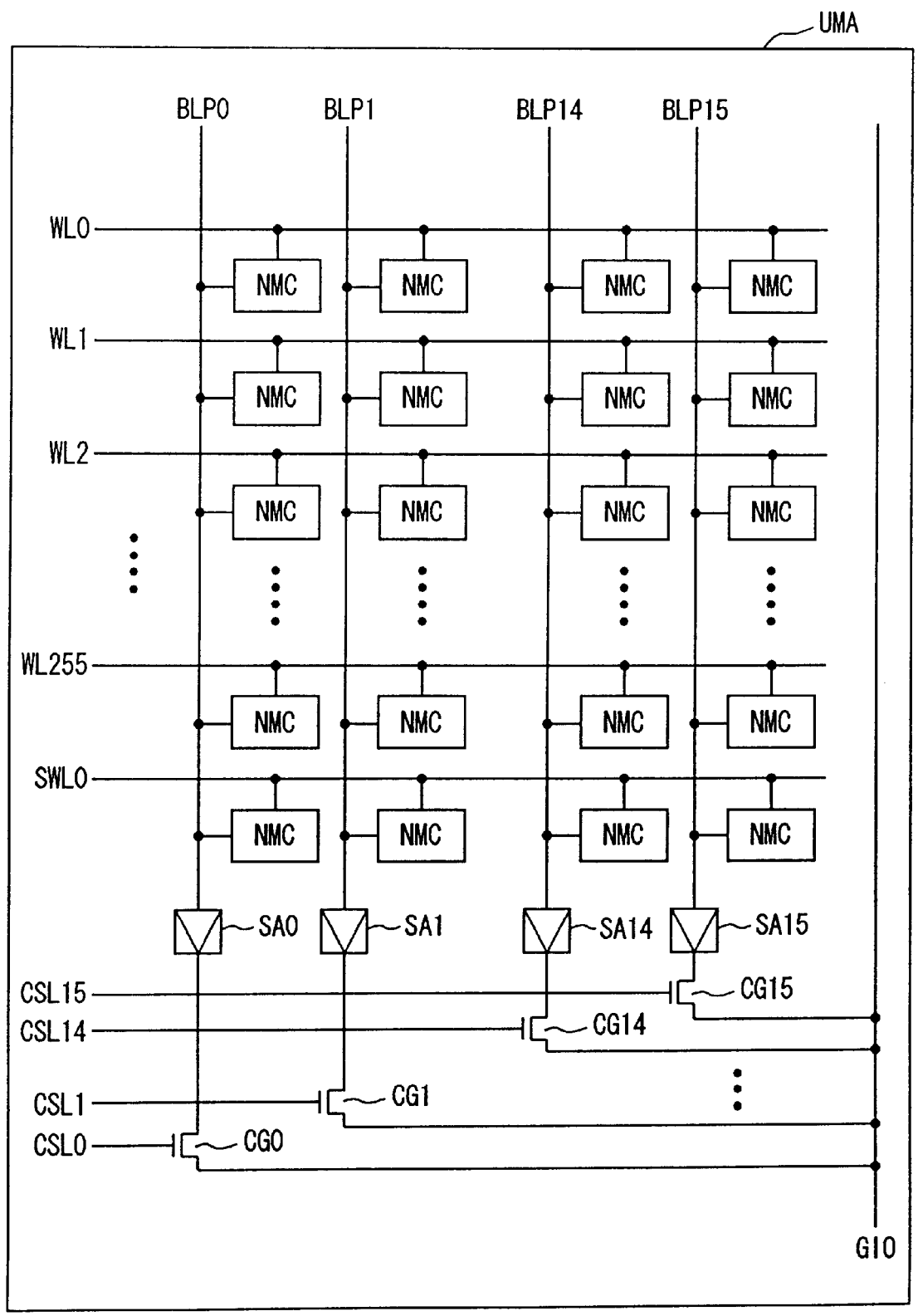
FIG. 21 is a diagram schematically showing the configuration of the unit memory array illustrated in FIG. 20.

The configuration of the memory array portion is similar to that of FIGS. 19 to 21. The memory array is divided into IO unit blocks, and the configuration of write data path 1 illustrated in FIG. 1 is provided for each IO unit block.

Configuration of Read Data Path

Figure 7:
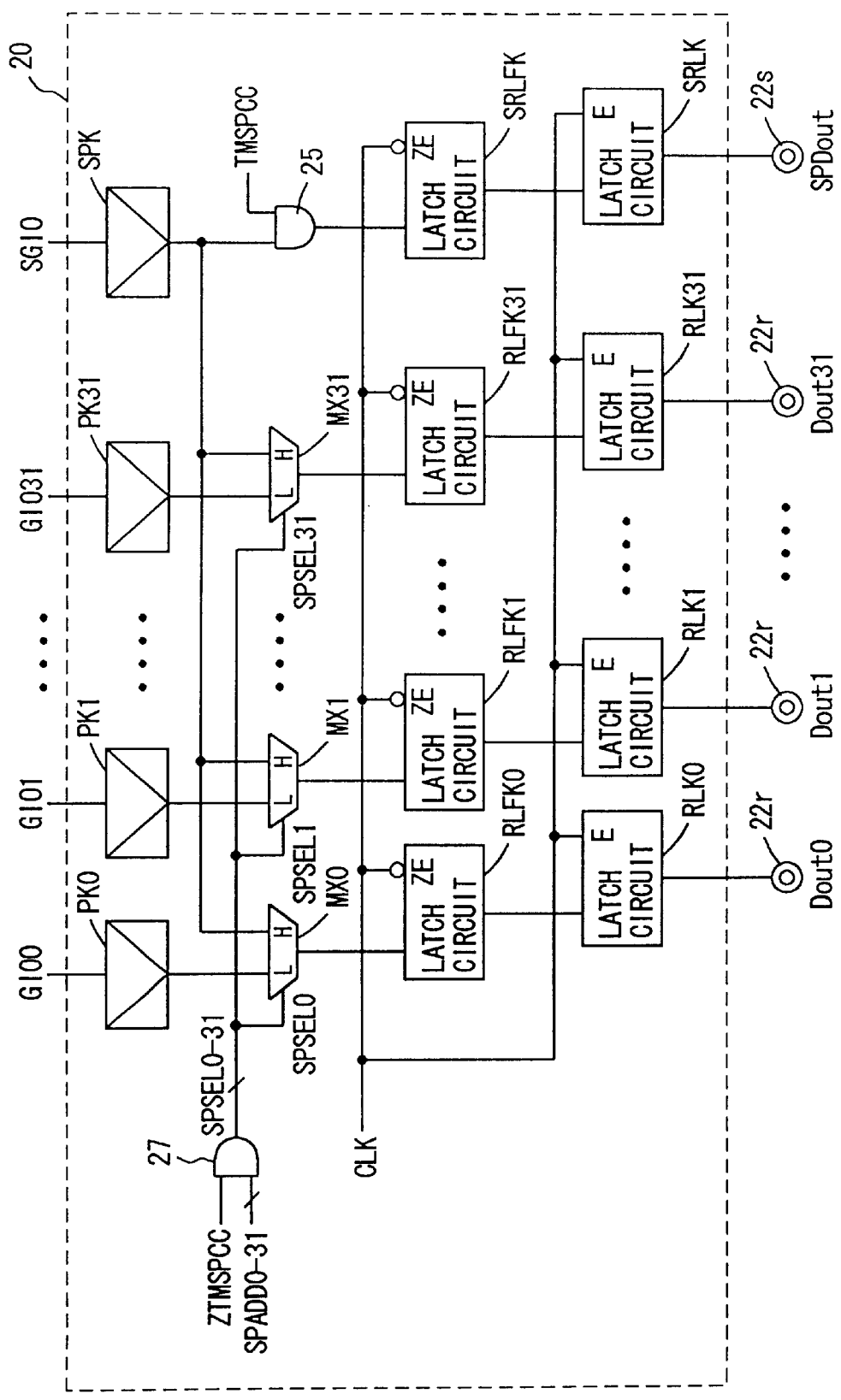
FIG. 7 is a diagram schematically showing the configuration of a read data path according to the first embodiment of the invention.

FIG. 7 is a diagram schematically showing an example of the configuration of a read data path for outputting data of the semiconductor memory device according to the first embodiment of the invention to the outside. A read data path 20 shown in FIG. 7 has a configuration different from that of the conventional read data path illustrated in FIG. 22 in the following point. A spare data output terminal 22s for outputting data read from the spare memory cell to the outside of the semiconductor memory device is provided. For spare data output terminal 22s, there is provided: an AND circuit 25 for receiving an output signal of spare preamplifier SPK and test mode spare control signal TMSPCC; a latch circuit SRLFK which enters the through state when clock signal CLK goes low, enters the latch state when clock signal CLK goes high, and transmits an output signal of AND circuit 25 in accordance with clock signal CLK; and a latch circuit SRLK which enters the through state when clock signal CLK goes high, enters the latch state when clock signal CLK goes low, and transmits an output signal of spare latch circuit SRLFK to spare data output terminal 22s synchronously with clock signal CLK.

Further, multiplexers MX0 to MX31 provided in correspondence with preamplifiers PK0 to PK31, respectively, receive spare selection signals SPSEL0 to SPSEL31 from an AND circuit 27 for obtaining the logical product of a complementary test mode spare control signal ZTMSPCC and each of spare address signals SPADD0 to SPADD31. In the present embodiment, also to multiplexer MX0 provided for preamplifier PK0, a spare selection signal SPSEL0 generated in accordance with complementary test mode spare control signal ZTMSPCC and spare address signal SPADD0 are applied.

Figure 22:
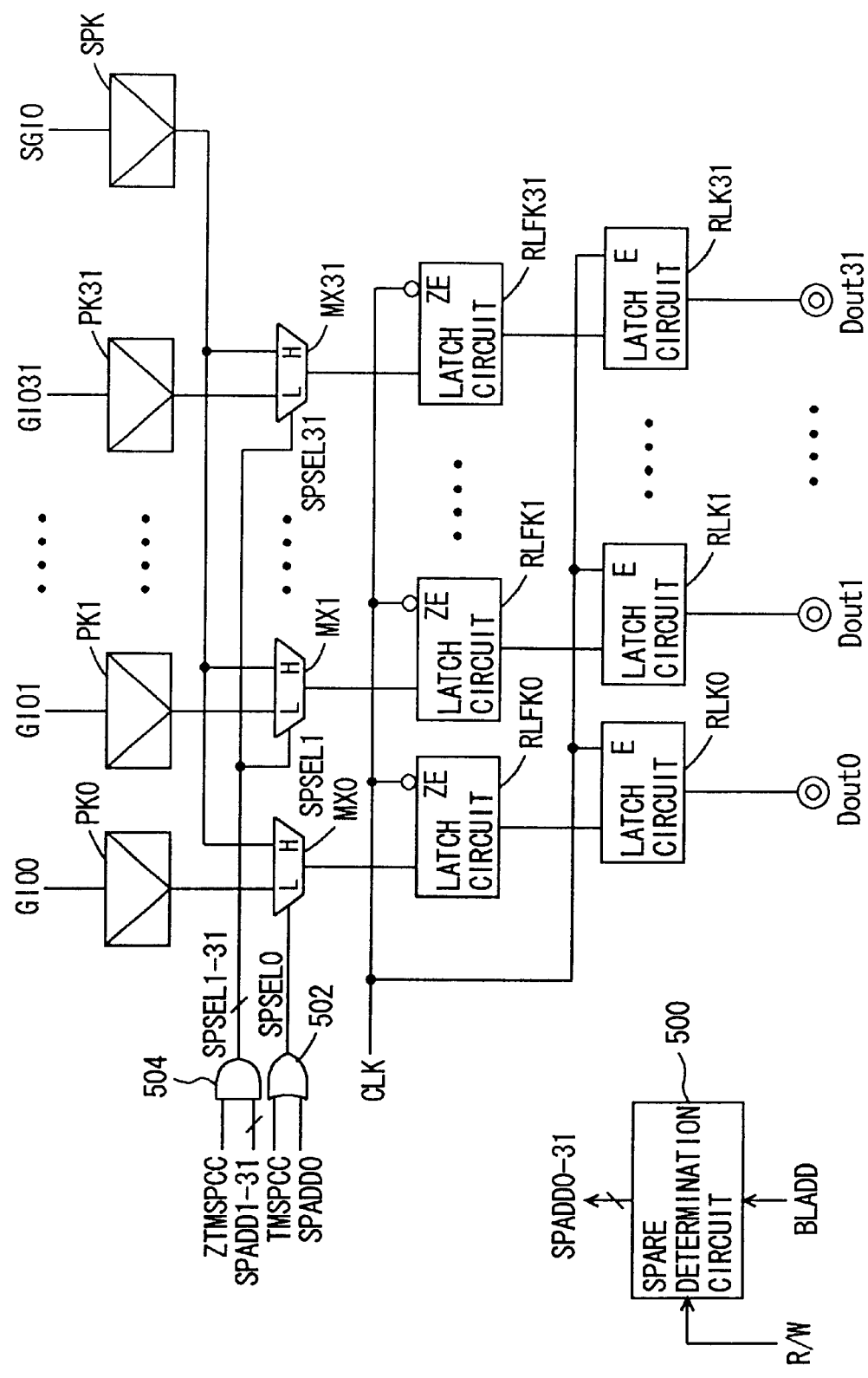
FIG. 22 is a diagram schematically showing the configuration of a read data path of the conventional logic merged DRAM chip.

The other configuration of read data path 20 shown in FIG. 7 is similar to that of the conventional read data path shown in FIG. 22, and the corresponding components are designated by the same reference numerals, and their detailed description will not be repeated. The configuration of the memory array portion is also similar to the conventional one.

In the configuration of read data path 20 shown in FIG. 7, in testing a spare memory cell, test mode spare control signal TMSPCC is set to the H level, and the complementary test mode spare control signal ZTMSPCC is set to the L level. In this state, AND circuit 25 operates as a buffer circuit, and the spare memory cell data transmitted from spare preamplifier SPK is transmitted to latch circuit SRLFK. Further, since the complementary test mode spare control signal ZTMSPCC is at the L level, all spare selection signals SPSEL0 to SPSEL3 from AND circuit 27 are at the L level, and multiplexers MX0 to MX31 select output signals of preamplifiers PK0 to PK31. Therefore, data of memory cells read on global data line pairs GIO0 to GIO31 and data from the spare memory cell read onto spare global data line pair SGIO are latched in parallel by latch circuits RLFK0 to RLFK31 and SRLFK synchronously with the falling edge of clock signal CLK. When clock signal CLK goes high, latch signals of latch circuits RLFK0 to RLFK31 and SRLFK are latched by latch circuits RLK0 to RLK31 and spare latch circuit SRLK and outputted in parallel to data output terminals 22r and the spare data output terminal 22s. By setting test mode spare control signal TMSPCC to the H level, the data read from the normal and spare memory cells can be transmitted in parallel to a tester on the outside of the semiconductor memory device.

When test mode spare control signal TMSPCC is set to the L level, an output signal of AND circuit 25 is fixed to the L level, thereby inhibiting transmission of the output signal of spare preamplifier SPK to latch circuit SRLFK. Since complementary test mode spare control signal ZTMSPCC goes high, spare selection signals SPSEL0 to SPSEL31 are generated according to spare address signals SPADD0 to SPADD31. In multiplexers MX0 to MX31, redundancy replacement for repairing a defective bit is performed according to the spare address. For example, when spare address signal SPADDi is at the H level, spare selection signal SPSELi goes high, multiplexer MXi selects an output signal of spare preamplifier SPK, and transmission of the corresponding preamplifier PKi is inhibited. Therefore, global data line pair GIOi corresponding to a defective bit is replaced by spare global data line pair SGIO, and data is read.

Figure 8A:
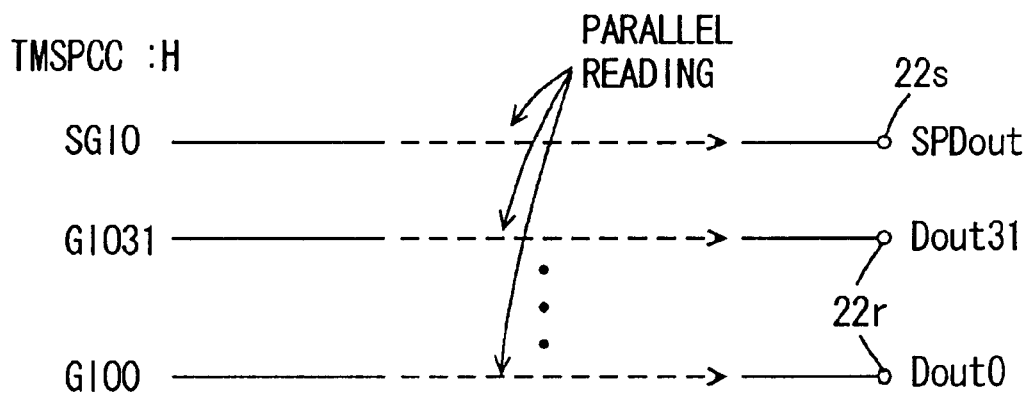
FIGS. 8A and 8B are diagrams schematically showing the coupling relation between internal data line pairs of the read data path and data output terminals shown in FIG. 7.
Figure 8B:
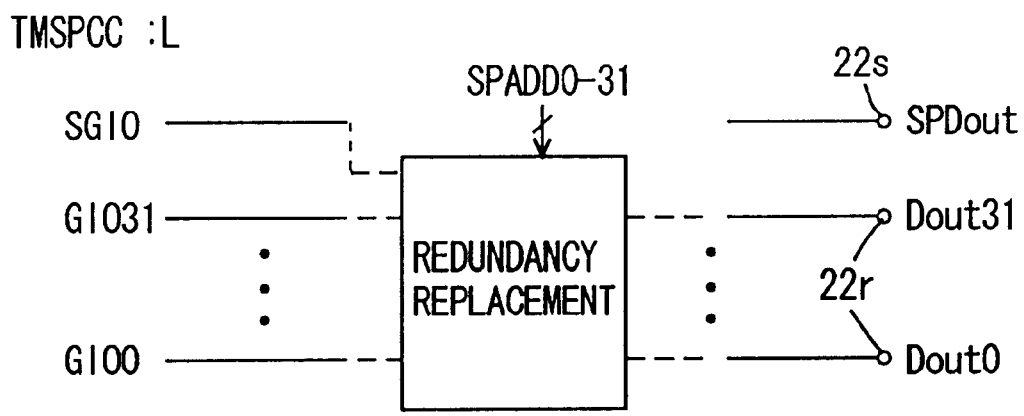

Specifically, as shown in FIG. 8A, when test mode spare control signal TMSTCC is at the H level, spare global data line pair SGIO and global data line pairs GIO0 to GIO31 are coupled in parallel to spare data output terminal 22s and data output terminals 22r and reading of data is performed. On the other hand, when test mode spare control signal TMSPCC is set to the L level, as shown in FIG. 8B, spare global data line pair SGIO and spare data output terminal 22s are isolated from each other, redundancy replacement of one of global data line pairs GIO31 to GIO0 with spare global data line pair SGIO is carried out according to spare address signals SPADD0 to SPADD31, and data obtained after the redundancy replacement is transmitted to corresponding data output terminal 22r.

In the case of detecting the existence of a defective bit, also in the data reading mode, both spare and memory cells can be accessed simultaneously, and test time in the data reading mode can be accordingly shortened.

By combining the foregoing write data path and read data path, at the time of detecting the existence of a defective bit, test data can be simultaneously written in parallel into the normal and spare memory cells, and can be simultaneously read in parallel from the normal and spare memory cells, and whether the spare and normal memory cells can be simultaneously determined to be normal or defective. The test time can be therefore reduced greatly.

The configuration of each of multiplexers MX0 to MX31 shown in FIG. 7 is the same as that of multiplexer 4 for performing 2:1 selecting operation illustrated in FIG. 5, and each of latch circuits RLFK0 to RLFK31 and SRLFK has the same configuration as that of latch circuit illustrated in FIG. 3, and each of RLSKO to RLSK31 and SRLFK has the same configuration as that of latch circuit WLK shown in FIG. 2. In the configuration shown in FIG. 7, to spare latch circuits SRLFK and SRLK, an ANDed signal of clock signal CLK and test mode spare control signal TMSPCC may be supplied. In normal practical use, it is unnecessary to operate spare latch circuits SRLFK and SRLK, so that they are fixed in the latch or through state, thereby reducing current consumption in the normal operation mode.

Complementary test mode spare control signal ZTM-SPCC is used to fix spare selection signals SPSEL0 to SPSEL31 irrespective of the logic levels of spare address signals SPADD0 to SPADD31 in testing the spare memory cells. Before programming the spare address in accordance with a defect address, when all spare address signals SPADD0 to SPADD31 are set to the L level, complementary test mode spare control signal ZTMSPCC does not have to be particularly used.

Configuration of Input/Output Units

Figure 9:
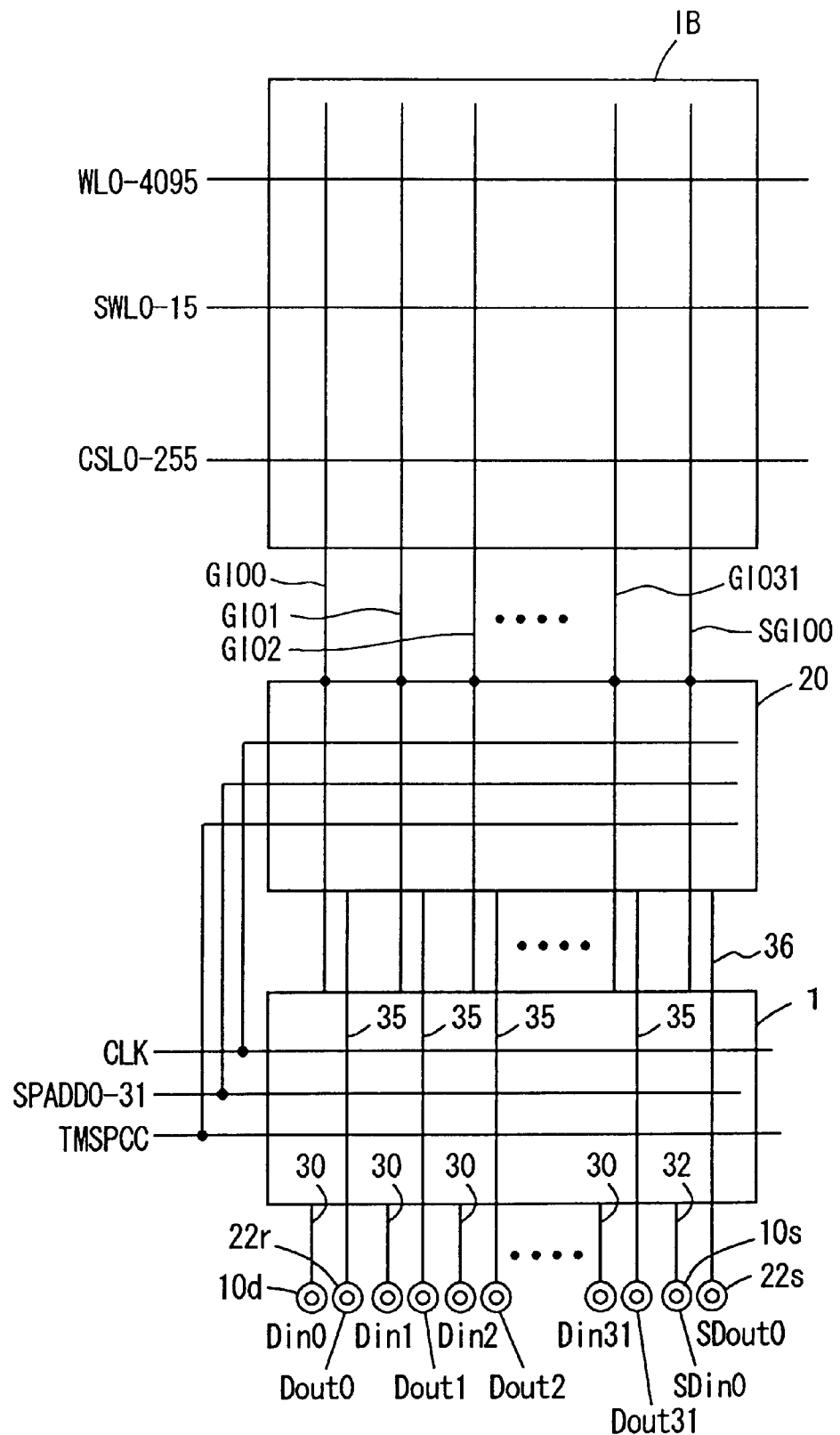
FIG. 9 is a diagram schematically showing the configuration of a portion related to an IO unit block of the semiconductor memory device according to the first embodiment of the invention.

FIG. 9 is a diagram schematically showing the corresponding relation between the IO unit block IB and data input/output terminals, according to the first embodiment of the invention. In the IO unit block IB, word lines WL0 to WL4095 are arranged and spare word lines SWL0 to SWL15 are arranged. In a single IO unit block, 16 row blocks are provided. In each row block, 16 column selection lines exist, and total 256 column selection lines CSL0 to CSL255 are disposed.

Global data line pairs GIO0 to GIO31 and spare global data line pair SGIO0 extending in the column direction over the IO unit block IB are coupled to read data path 20 and write data path 1. To read data path 20 and write data path 1, clock signal CLK, spare address signals SPADD0 to SPADD31, and test mode spare control signal TMSPCC are commonly supplied.

Read data path 20 is coupled to a data output terminals 22r via output data lines 35, and is coupled to spare data output terminal 22s via a spare data output line 36. On the other hand, write data path 1 is coupled to write data input terminals 10d via input data lines 30 and coupled to spare data input terminal 10s via a spare data input line 32.

In the configuration of the data path shown in FIG. 9, read data path 20 and write data path 1 are coupled to read data terminals and write data terminals, respectively. Usually, in an embedded DRAM, a logic and a DRAM are integrated on the same chip and are coupled to each other via interconnection lines on the chip. Since pin terminals do not have to be provided for the embedded DRAM, even when data output terminals 22r and data input terminals 10d are separately provided, pin terminals are not provided and therefore data bus lines between the logic and the DRAM can be disposed in a small occupying area. A large amount of data bits can be transferred in a single data transfer cycle, and a bandwidth of data transfer can be widened.

Modification of Configuration of Input/Output Portion

Figure 10:
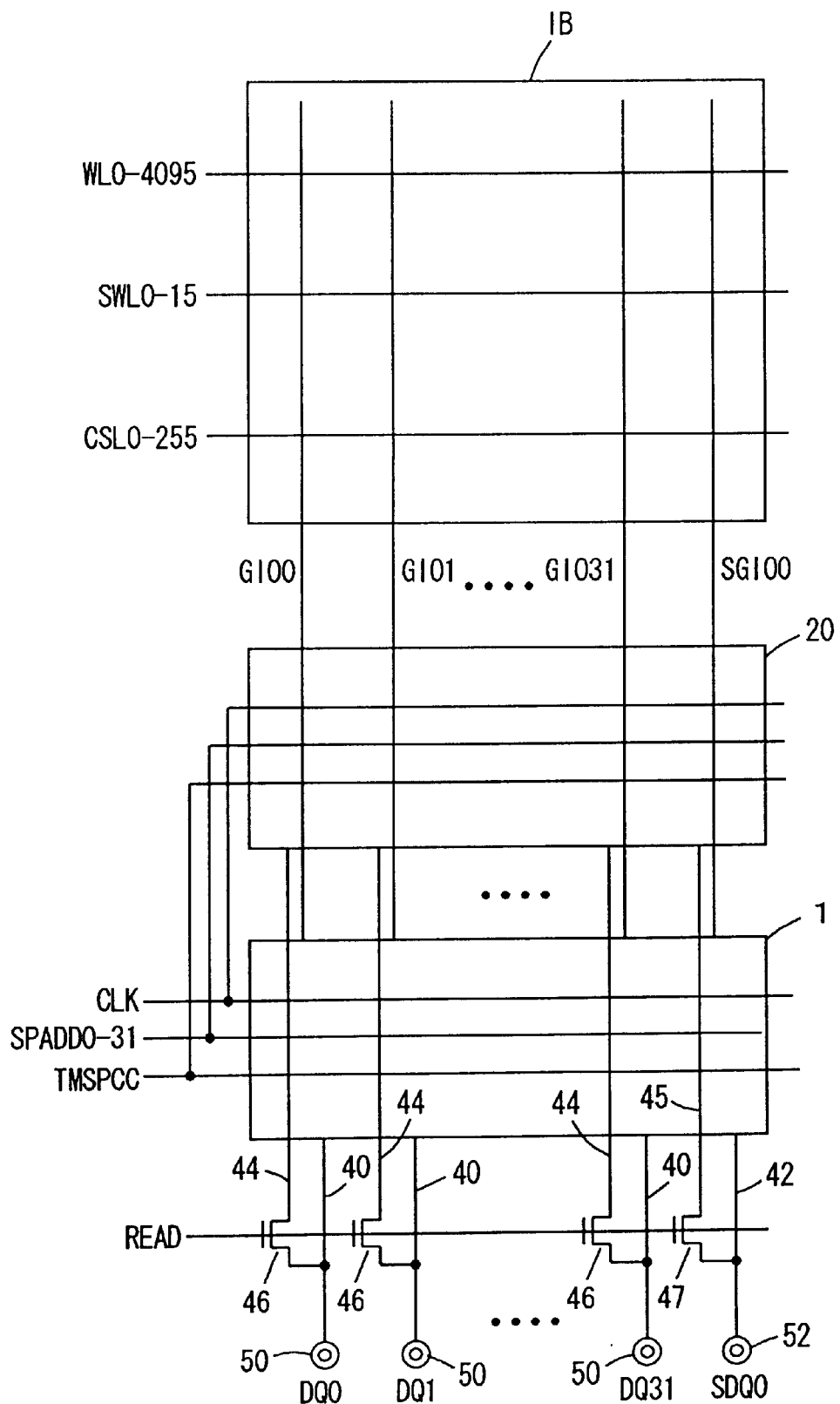
FIG. 10 is a diagram schematically showing another correspondence between the unit block and the data terminals in accordance with the first embodiment of the invention.

FIG. 10 is a diagram schematically showing a modification of the configuration of the data input/output portion of the semiconductor memory device according to the present invention. In FIG. 10, write data path 1 is coupled to data input/output terminals 50 via input data lines 40, and coupled to a spare data input/output terminal 52 via a spare data input line 42. On the other hand, read data path 20 is coupled to internal read data lines 44 and an internal spare read data line 45. Internal read data line 44 is coupled to a corresponding data input/output terminal 50 via a transfer gate 46 that is made conductive according to a read mode instruction signal READ. Similarly, internal spare read data line 45 is coupled to spare data input/output terminal 52 via a transfer gate 47 which is made conductive when read mode instruction signal READ is activated.

In the configuration shown in FIG. 10, therefore, read data and write data are commonly supplied to data input/output terminals 50 and spare data input/output terminals 52. Where read data path 20 and write data path 1 are separately provided and are commonly coupled to global data line pairs GIO0 to GIO31 and spare global data line pair SGIO0, by coupling read data path 20 selectively to data input/output terminals 50 and 52 by using transfer gates 46 and 47, even the configuration having read data path 20 and write data path 1 disposed according to a separated IO configuration (in which a data input terminal and a data output terminal are separately provided) can be applied to an IO common configuration (data writing and data reading are carried out via the same terminal).

Transfer gates 46 and 47 responsive to read mode instruction signal READ are used for the following reason. In the case of writing data, usually, write data is supplied simultaneously with a write command instructing data writing. On the other hand, in the case of reading data, when a read command is supplied, after elapse of a predetermined time period (column latency), read data is output to the outside of the memory device via read data path 20. Since write data is supplied from a logic on the outside of the memory device, when read data lines 44 coupled to read data path 20 are coupled to the data input/output terminals in parallel with input data lines 40, the load on the logic becomes heavier. Consequently, transfer gate 46 is provided to couple internal read data line 44 to data input/output terminal 50 only in reading data, thereby reducing the load of inputting the write data bit in the normal operation. In the data reading mode, the semiconductor memory device only outputs data to the logic side. In this case, by increasing the driving capability of the output drivers of read data path 20, read data can be transmitted to the logic at higher speed. In the data reading operation, input data lines 40 and 42 may be isolated from data input/output terminals 50 and 52. Consequently, the load on the data output circuit is reduced.

As described above, according to the first embodiment of the invention, since the terminal for writing/reading data to/from the spare memory cell is provided separately from a terminal used for regular data input and output, at the time of a test of detecting a defective memory cell, both spare and normal memory cells can be accessed simultaneously, so that the test time for detecting a defective bit can be shortened.

Second Embodiment

Figure 11:
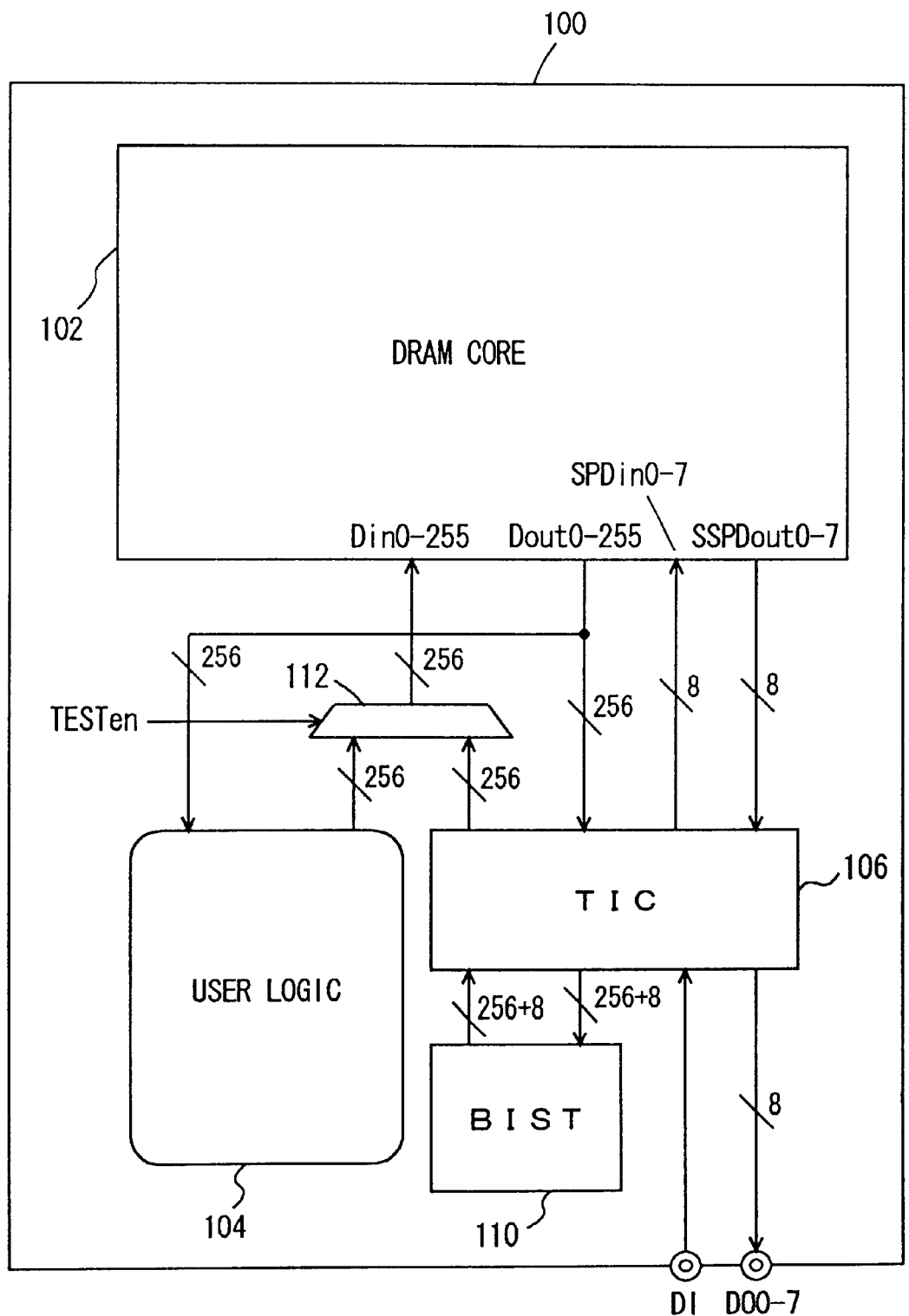
FIG. 11 is a diagram schematically showing the configuration of a system LSI according to a second embodiment of the invention.

FIG. 11 is a diagram showing the configuration of a semiconductor integrated circuit device according to a second embodiment of the invention. The semiconductor integrated circuit device is a system LSI in which a semiconductor memory device (DRAM) according to the first embodiment of the invention and a logic are formed on the same chip.

In FIG. 11, a semiconductor integrated circuit device 100 includes: a DRAM core 102 having the configuration of the semiconductor memory device (DRAM) according to the foregoing first embodiment of the invention; a test interface circuit (TIC) 106 for performing a test by directly accessing DRAM core 102 from an external tester; a built-in self-test circuit (BIST) 110 for pre-storing a test program and performing a test on DRAM core 102; a user logic 104 for accessing DRAM core 102 to process necessary data, and others; and a multiplexer 112 for selecting either output data of user logic 104 or write data from test interface circuit 106 in accordance with a test mode instruction signal TESTen and supplying the selected one to DRAM core 102.

Usually, user logic 104 transmits and receives data to and from an external device of semiconductor integrated circuit device 100 and executes a predetermined process such as an image process.

DRAM core 102 includes eight IO unit blocks in the foregoing first embodiment. Therefore, eight read data paths 20 and eight write data paths 1 are provided, input data of 256 bits, Din0 to Din255, is received via multiplexer 112, and output data of 256 bits, Dout0 to Dout255, is transmitted to test interface circuit 106 and user logic 104. Spare write data of eight bits, SPDin0 to SPDin7, is supplied from test interface circuit 106 to DRAM core 102, and spare read data of eight bits, SPDout0 to SPDout7, is supplied from DRAM core 102 to test interface circuit 106.

Test interface circuit 106 receives one-bit input data DI from the tester and supplies output data of eight bits, DO0 to DO7, to the tester. Usually, DRAM core 102 is coupled to user logic 104 via on-chip interconnection lines. The write/read data bus width is wider than that of a single standard DRAM chip. An external data output bus and a data input bus of DRAM core 102 are not coupled to the outside of semiconductor integrated circuit device 100. Test interface circuit 106 is provided so that DRAM core 102 is accessed from the outside via test interface circuit 106 to carry out a test on DRAM core 102.

Usually, a command instructing an operation mode in a test, an address signal, and a test clock signal for serving as a clock signal in the test are supplied to test interface circuit 106. Test mode instruction signal TESTen is applied from the external tester. Alternately, test mode instruction signal TESTen may be generated by test interface circuit 106 itself in response to a test instructing command from an external tester.

In the configuration of semiconductor integrated circuit device 100 shown in FIG. 11, test interface circuit 106 generates write data of 256 bits and spare write data of eight bits SPDin0 to SPDin7 to DRAM core 102 in accordance with test input data DI of one bit. That is, the data of total 264 bits is generated from one-bit test input data DI. On the other hand, the 264-bit test read data is supplied from DRAM core 102 to test interface circuit 106. In outputting data to an external tester, test interface circuit 106 generates data of eight bits from data of 264 bits supplied synchronously with a test clock signal (not shown) and sequentially outputs the 8-bit data.

Built-in self-test (BIST) circuit 110 generates a test pattern according to a test program pre-stored in the semiconductor integrated circuit device, and determines a result of the test of DRAM core 102, whether a defect can be repaired or not, and identifies a repair address. BIST circuit 110 is an on-chip circuit, and has a data bus width not limited by a pin terminal. Consequently, BIST circuit 110 can access the data input and output terminals of DRAM core 102 and spare input and output terminals via test interface circuits 106. In the case of using BIST circuit 110, therefore, the normal and spare memory cells can be simultaneously tested in parallel, the result of the test can be determined, whether a defect can be repaired or not can be determined, and a defect address can be identified. Thus, test time can be greatly shortened. The configuration of each of the components will now be described in detail.

Figure 12:
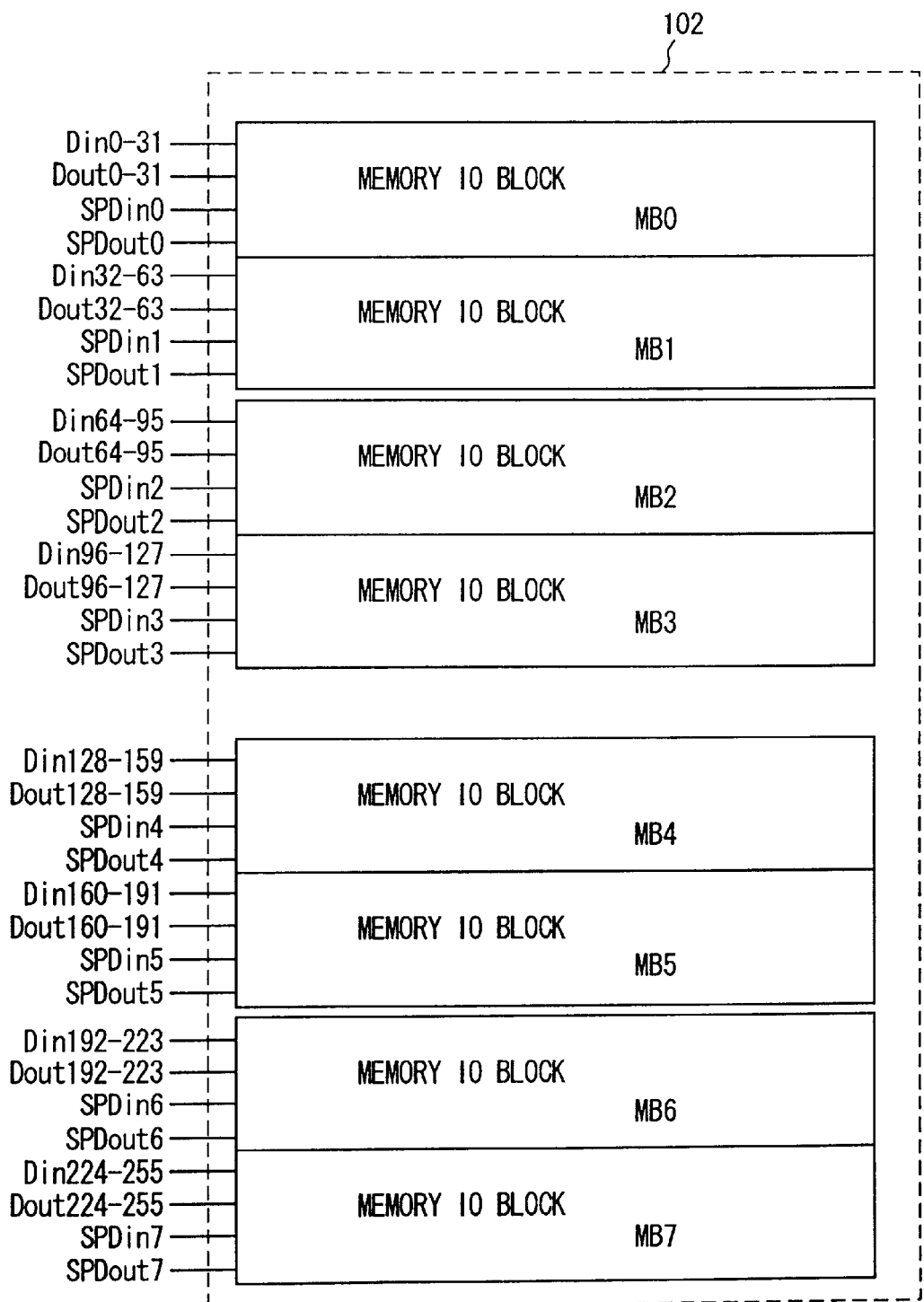
FIG. 12 is a diagram schematically showing the configuration of a DRAM core illustrated in FIG. 11.

FIG. 12 is a diagram schematically showing an example of the configuration of DRAM core 102 illustrated in FIG. 11. In FIG. 12, DRAM core 102 includes eight memory IO blocks MB0 to MB7. Each of memory IO blocks MB0 to MB7 includes an IO unit block having 32 global data line pairs GIO and a single spare global data line SGIO, and the read data path and write data path described in the foregoing first embodiment. In a normal operation mode, to/from each of memory blocks MB0 to MB7, data of 32 bits is input/output. That is, data of total 256 bits is input/output. In the case of writing/reading spare memory cell data, spare memory cell write data SPDin and spare memory cell read data SPDout is input/output to/from each of memory IO blocks MB0 to MB7. Spare input data of total eight bits, SPDin0 to SPDin7, is supplied to DRAM macro block 102, and spare memory cell read data of eight bits, SPDout0 to SPDout7, is output from DRAM macro block 102.

Each of input data Din<255:0> and output data Dout<255:0> is divided into 32 bits and allocated to memory IO blocks MB0 to MB7. As the internal configuration of DRAM core 102, the configuration shown in the foregoing first embodiment is used for each of memory IO blocks MB0 to MB7. In accordance with test mode spare control signal TMSPCC, therefore, the test is simultaneously performed on the normal memory cells and spare memory cells. In the case of performing a test under the control of an external tester via test interface circuit 106, the test mode instruction signal from the external tester is decoded by test interface circuit 106 to generate various test control signals. Alternately, test interface circuit 106 may perform a decoding operation in accordance with a test mode instruction signal received from the external tester to generate test mode instruction signal TESTen and test mode spare control signal TMSPCC. When a test is performed under the control of BIST circuit 110, test mode instruction signal TESTen as well as test mode spare control signal TMSPCC is generated by BIST circuit 110.

Figure 13:
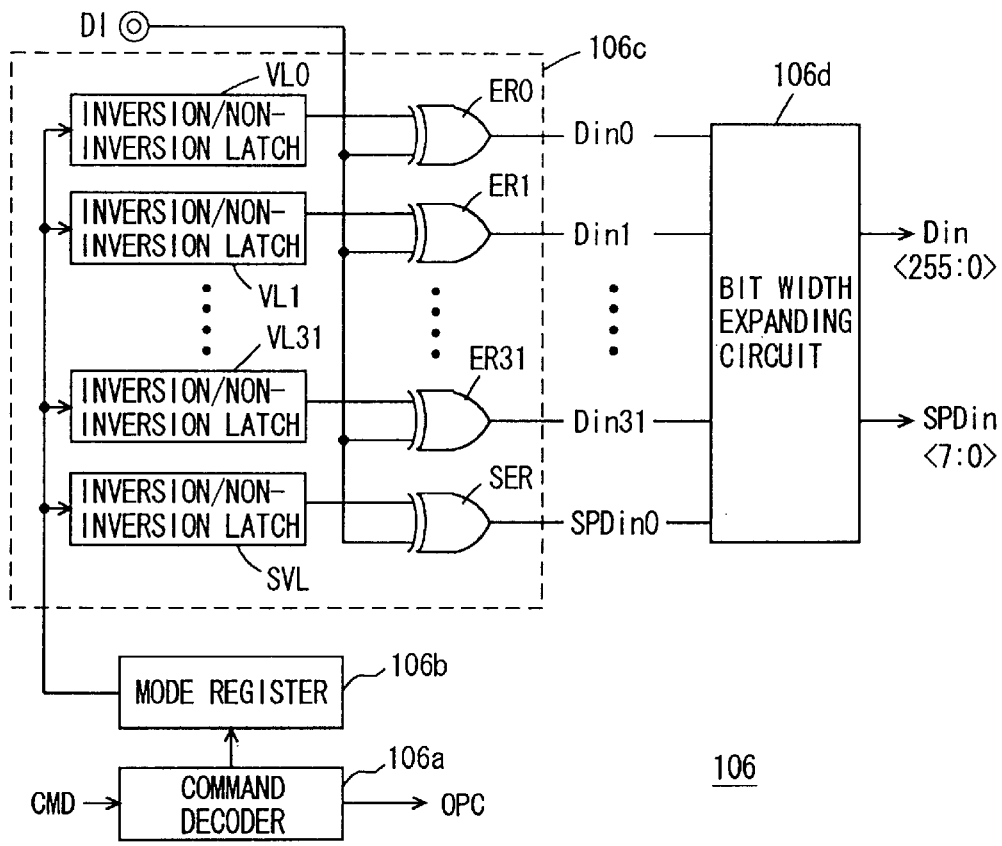
FIG. 13 is a diagram schematically showing an example of the configuration of a write data generating circuit in a test interface circuit illustrated in FIG. 11.

FIG. 13 is a diagram schematically showing the configuration of a write data generating circuit included in test interface circuit 106. In FIG. 13, test interface circuit 106 includes: a command decoder 106a for decoding a command CMD supplied from the external tester to generate an operation mode instruction signal OPC; a mode register 106b for storing data indicative of a data pattern under the control of command decoder 106a; a write data generating circuit 106c for generating internal test input data Din0 to Din31 and spare input data SPDin0 in accordance with test input data DI from the external tester and pattern setting data from mode register 106b; and a bit width expanding circuit 106d for expanding write data Din<31:0> and spare write data SPDin0 generated by write data generating circuit 106c to write test data Din <255:0> and spare write data SPDin<7:0>, respectively.

When a mode register set command is supplied, under the output control of command decoder 106a, mode register 106b takes in, for example, an address signal bit supplied to a predetermined address input terminal and generates a test pattern.

Write data generating circuit 106c includes: inversion/non-inversion latches VL0 to VL31 provided in correspondence with test input data bits Din0 to Din31 and having their respective states set by mode register 106b; inversion/non-inversion latch SVL provided in correspondence with spare test input data bit STDin and having its state set by mode register 106b; and EXOR circuits ER0 to ER31 and SER provided in correspondence with inversion/non-inversion latches VL0 to VL31 and SVL, respectively, and each for receiving an output signal of a corresponding inversion/non-inversion latch and test input data bit DI. Test input data bits Din0 to Din31 are generated from EXOR circuits ER0 to ER31, respectively, and a spare test input data bit SPDin0 is generated from EXOR circuit SER.

Bit width expanding circuit 106d is constructed by, for example, interconnection lines and expands data of 33 bits to data Din<255:0> of 264 bits and SPDin<7:0> through interconnection of data lines.

In inversion/non-inversion latches VL0 to VL31 and SVL, the signal of the H level or L level is stored by mode register 106b. When the inversion/non-inversion latches VL0 to VL31 and SVL latch and output the H-level signal, EXOR circuits ER0 to ER31 and SER operate as inverters for inverting test input data DI to generate data bits Din0 to Din31 and SPDin0. On the other hand, when inversion/non-inversion latches VL0 to VL31 and SVL latch the L-level signal and output the signal, EXOR circuits ER0 to ER31 and SER operate as buffer circuits to generate input data bits Din0 to Din31 and SPDin0 in accordance with test input data DI.

According to the configuration of the write data generating circuit shown in FIG. 13, therefore, a test data pattern can be set on a memory IO block basis.

In the configuration shown in FIG. 13, the data bit pattern is set on the memory IO block basis. However, when there is a available space on the chip, an inversion/non-inversion latch and an EXOR circuit may be provided for each of data bits Din<255:0> and SPDin<7:0>. Each of inversion/non-inversion latches VL0 to VL31 and SVL is constructed by, for example, a set/reset flip flop.

Mode register 106b may be constructed so as to set the states of inversion/non-inversion latch circuits VL0 to VL31 and SVL for each plurality of bits such as four bits in accordance with the storage capacity or output bit width thereof.

Configuration of Test Interface Read Data Determining Circuit

Figure 14:
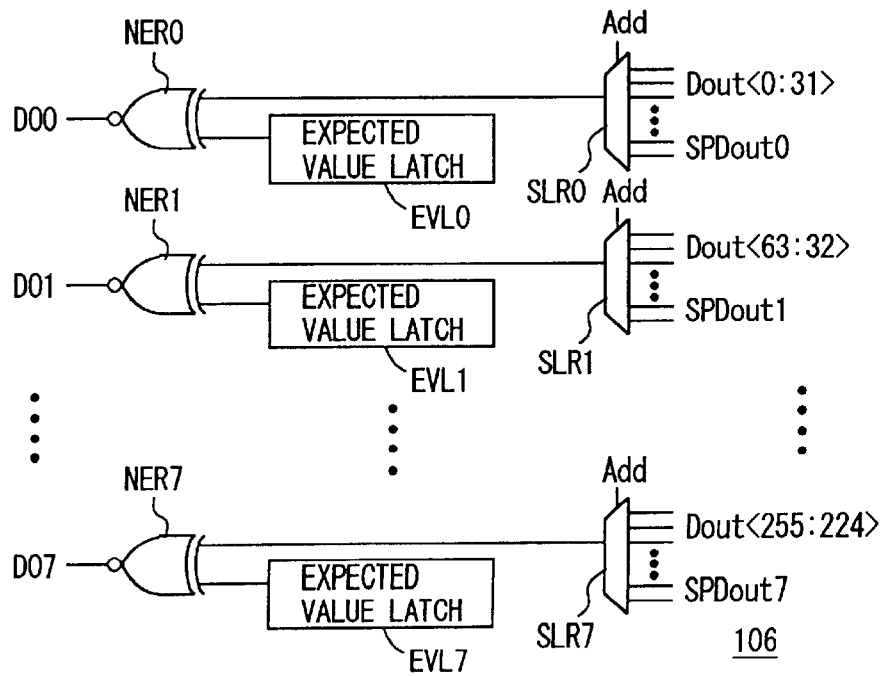
FIG. 14 is a diagram schematically showing an example of the configuration of a read determining circuit in the test interface circuit illustrated in FIG. 11.

FIG. 14 is a diagram showing an example of the configuration of a read data determining circuit included in test interface circuit 106. In FIG. 14, the read data determining circuit includes multiplexers SLR0 to SLR7 provided in correspondence with memory IO blocks MB0 to MB7, respectively, each for selecting an output data bit of a corresponding memory IO block in accordance with an address signal Add; expected value latches EVL0 to EVL7 for latching expected values of read data from the memory IO blocks; and NXOR circuits NER0 to NER7 provided in correspondence with multiplexers SLR0 to SLR7, respectively, for comparing output data bits of the respective multiplexers SLR0 to SLR7 with expected values stored in corresponding expected value latches EVL0 to EVL7 and outputting signals indicative of the result of comparison to data output terminals DO0 to DO7.

In each of expected value latches EVL0 to EVL7, expected values of 33-bit data stored in a corresponding memory IO block are stored. For example, by latching output data bits of the write data generating circuit shown in FIG. 13, expected values of 33 bits can be easily stored in each of expected value latches EVL0 to EVL7. In reading test data, address signal Add is generated in test interface circuit 106 so as to select 32-bit data Dout and spare memory cell data SPD from the memory IO block in a predetermined sequence. Address signal Add may be generated by using a shifter for performing a shifting operation synchronously with the clock signal.

In the configuration shown in FIG. 14, 33-bit data is selected one bit by one bit by each of multiplexers SLR0 to SLR7 and compared with the expected values stored in expected value latches EVL0 to EVL7. When data read from multiplexers SLR0 to SLR7 coincide with data stored in expected value latches EVL0 to EVL7, NXOR circuits NER0 to NER7 each output a signal of the H level to a corresponding one of data output terminals DO0 to DO7. When a data read bit does not coincide with the corresponding expected value, a corresponding one of NXOR circuits NER0 to NER7 outputs a signal of the L level to a corresponding one of data output pin terminals DO0 to DO7.

In the configuration of the read data determining circuit shown in FIG. 14, therefore, the data D<255:0> and spare memory cell data SPDout<7:0> read from the normal memory cells are sequentially selected on the 8-bit basis and a determining operation is performed. Since the spare and normal memory cell data cannot be simultaneously determined, particularly, in the test data reading mode, it is not required to simultaneously read the spare memory cell data and the normal memory cell data. When the spare memory cell and the normal memory cell are simultaneously accessed as for DRAM core 102, not much time difference is caused due to the selecting operation in multiplexers SLR0 to SLR7. It is sufficient to read data of the spare memory cell, for example, during 32 cycles in which the determining operation is performed on the normal memory cells. Alternately, after performing the determining operation on all the normal memory cells, the determining operation on spare memory cells may be performed. In this case, by switching the test mode to spare memory cell selection during the determining operation on the normal memory cells, overhead at the time of switching the test mode can be reduced. It is not therefore particularly required to simultaneously read spare memory cell data and normal memory cell data.

In the case of the configuration of the read test data determining circuit shown in FIG. 14, in a bit width expanding circuit, bit width expansion is performed, and writing operation is performed such that data bits in a corresponding position in the memory IO blocks have the same logical value. Since the same expected value is stored in expected value latches EVL0 to EVL7, alternative to expected value latches EVL0 to EVL7, one expected value latch EVL may be provided in common to multiplexers SLR0 to SLR7.

It is also possible to classify test data and supply the resultant data to multiplexer SLR such that the bits at the same position in 32-bit data from the memory IO blocks are transmitted to the same terminal. For example, bits Dout0, Dout32, Dout64, . . . are supplied to the common multiplexer. In this case, however, 32 multiplexers have to be provided. The multiplexer shown in FIG. 14 is disposed every four multiplexers in the 32 multiplexers, and a selecting operation is further performed to generate 8-bit data. In the case of the configuration, bits of spare memory cell data are supplied in parallel to eight multiplexers at the final stage.

Modification of Read Data Determining Circuit

Figure 15:
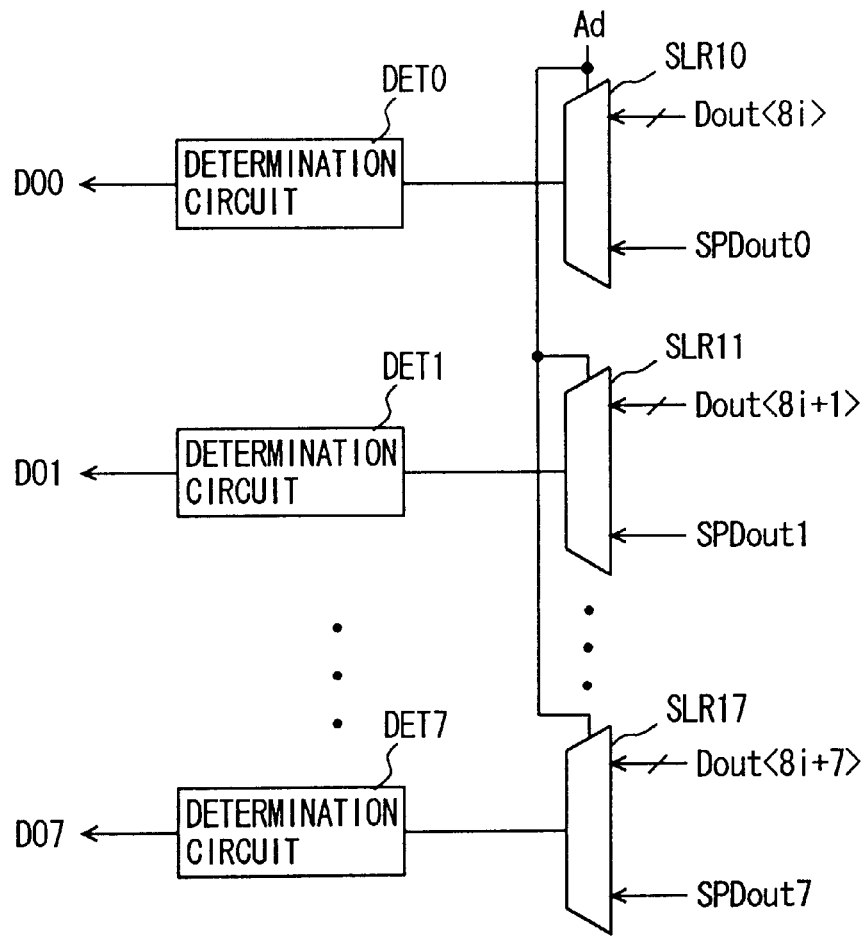
FIG. 15 is a diagram schematically showing a modification of the read determining circuit illustrated in FIG. 14.

FIG. 15 is a diagram schematically showing a modification of a read data determining circuit in the test interface circuit. In FIG. 15, data bits Dout<255:0> and SPDout<7:0> read from the DRAM core are classified by bit numbers of modulo 8. Specifically, read data from the DRAM core is classified into data bits Dout<8i>, Dout<8i+1>, . . . Dout<8i+7>, where i denotes 0 to 31. To respective data bit groups, spare memory cell read data SPDout0 to SPDout7 are applied. For the respective data bit groups, multiplexers SLR10 to SLR17 for performing the selecting operation in accordance with the address signal Ad are provided. Multiplexer SLR10 receives data bit group Dout<8i> and spare read data SPDout0. Multiplexer SLR11 receives data bit group Dout<8i+1> and spare memory cell read data SPDout1. Similarly, multiplexer SLR17 receives data bit group Dout<8i+7> and spare memory cell read data SPDout7.

In correspondence with multiplexers SLR10 to SLR17, determining circuits DET0 to DET7 are provided. Each of determining circuits DET0 to DET7 includes the expected value latch shown in FIG. 14 and an NXOR circuit and outputs a result of the determination to corresponding one of data pin terminals DO0 to DO7. In the configuration shown in FIG. 15, data bit groups are classified by modulo 8. Therefore, data bits in the same position in the memory IO blocks of the DRAM core are selected by multiplexers SLR10 to SLR17 and supplied to determining circuits DT0 to DT7. Test write data of 33 bits generated by the write data generating circuit shown in FIG. 13 is supplied to determining circuits DET0 to DET7 and latched by latch circuits. In each of determining circuits DET0 to DET7, expected value data of four bits for normal memory cells and an expected value of one bit for the spare memory cell are stored. Four bits of normal memory cell data are sequentially and cyclically read as an expected value. Specifically, determining operation is performed on data bit Dout<7:0> and then determining operation is performed on data bit Dout<15:8>. When the determination operation is performed four times, determination on the 32 normal memory cells of one IO block is completed. The operation is repeated and, after completion of the determining operation on the normal memory cells, finally, determining operation on spare memory cell data SPDout<7:0> is performed.

It is also possible to sequentially perform the determining operation by using the configuration shown in FIG. 15 after reading spare memory cell data in parallel with normal memory cell data. However, in this case, in data pin terminals DO0 to DO7, after performing the determining operation on 32 data bits, the determining operation is performed on the spare memory cell data. Therefore, it is not particularly required to read the spare memory cell data and the normal memory cell data simultaneously. While performing the determining operation on the normal memory cell data, the reading operation of the following memory cell data is performed.

Figure 16:
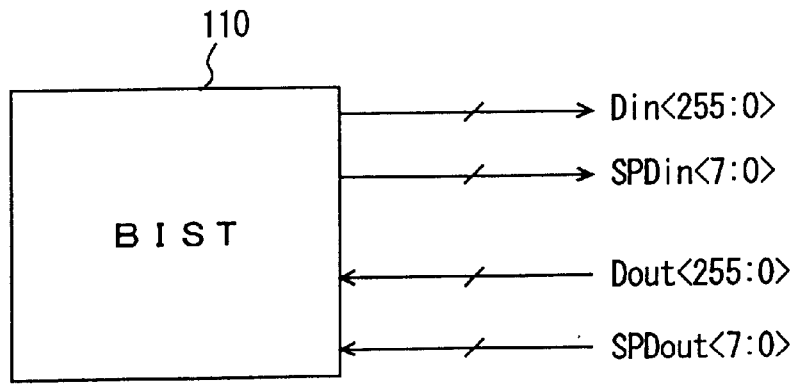
FIG. 16 is a diagram schematically showing the coupling relation between a built-in self-test circuit and the data input/output terminals of the DRAM core illustrated in FIG. 11.

FIG. 16 is a diagram schematically showing the configuration of input/output data of built-in self-test (BIST) circuit 110 illustrated in FIG. 11. BIST circuit 110 is formed on the same semiconductor chip with the DRAM core and can be coupled to the DRAM core via one-chip interconnection lines. In BIST circuit 110, therefore, as test data, data Ddin<255:0> for the normal memory cells of 256 bits and input data SPDin<7:0> for spare memory cells are generated in parallel and supplied to the DRAM core. Similarly, BIST circuit 110 can receive test output data Ddout<255:0> of 256 bits and spare memory cell read data SPDout<7:0> in parallel from the DRAM core. Therefore, in the case of performing the determining operation by using the BIST circuit 110, by simultaneously accessing the normal memory cell and spare memory cell in the DRAM core, test time can be greatly shortened.

According to the configuration of a tester for the DRAM core used in the system LSI, a method of sequentially accessing spare memory cell data and normal memory cell data or a method of simultaneously accessing the normal memory cell and spare memory cell is selectively used for reading test data. Particularly, in the case of the test read data determining circuit in the test interface circuit, 33-bit data is applied to one multiplexer. Consequently, the number of addresses generated is not a multiple of 2 and it is difficult to generate addresses through the decoding operation (but the configuration of sequentially turning on transfer gates in the multiplexer simply through the shifting operation can be used). In the case of reading and determining test data in the test interface circuit, by sequentially accessing the normal and spare memory cells, an address of selecting data in an eight-bit unit can be easily generated by the decoding operation.

Figure 17:
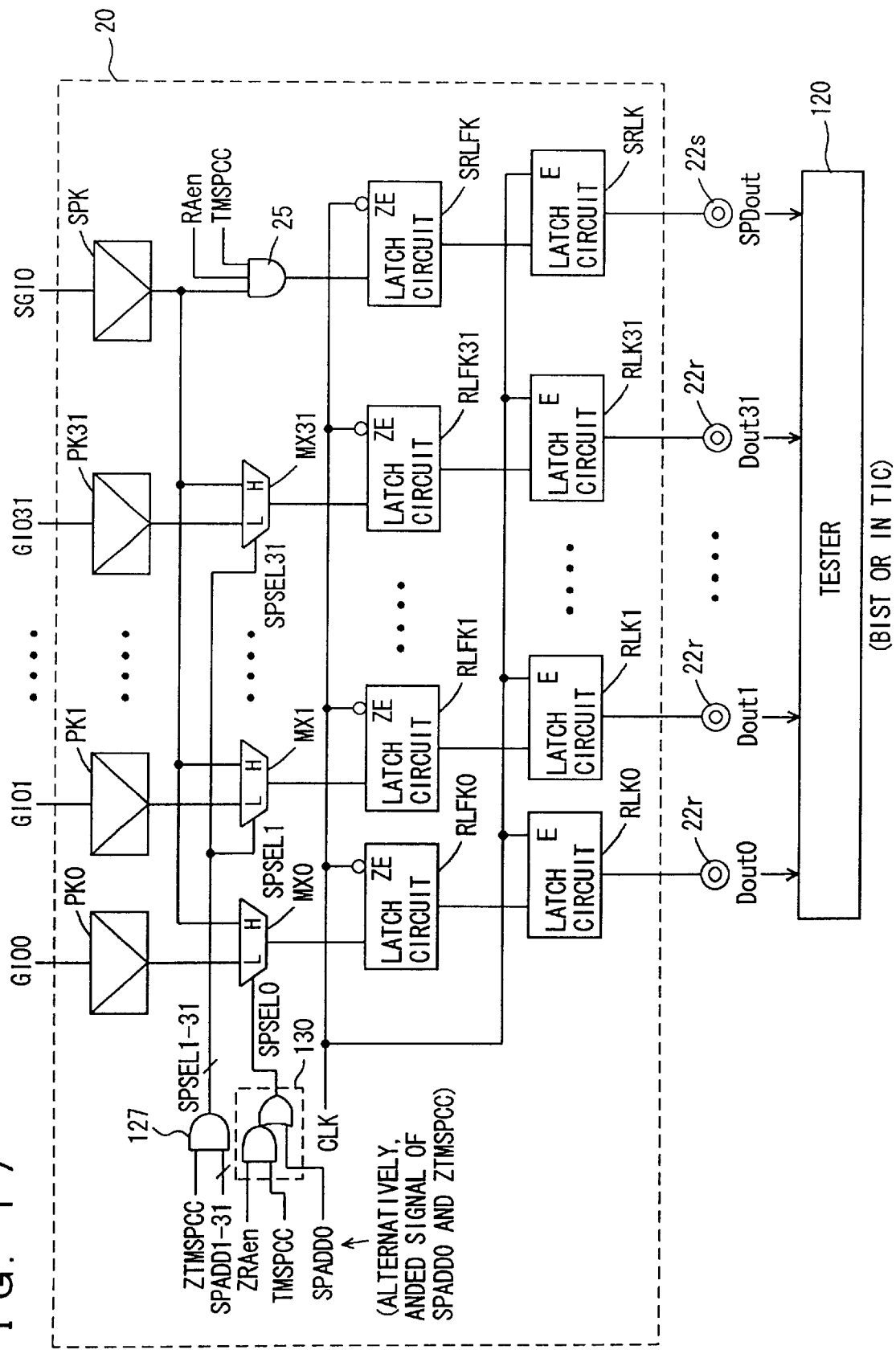
FIG. 17 is a diagram schematically showing the configuration of a read data path of a DRAM core according to the second embodiment of the invention.
Figure 18:
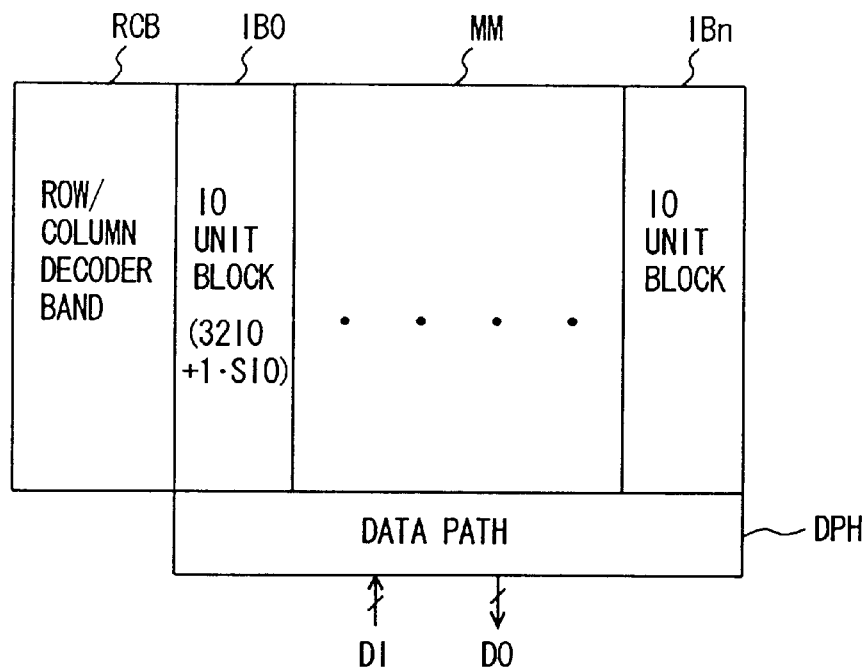
FIG. 18 is a diagram schematically showing the configuration of a main portion of a conventional logic merged DRAM chip.

FIG. 17 is a diagram schematically showing the configuration of a read data path according to a second embodiment of the invention. FIG. 17 shows the configuration of a read data path for one IO unit block. In read data path 20 shown in FIG. 17, for latch circuit SRLFK for latching an output signal of spare preamplifier SPK, an AND circuit 125 for receiving test mode spare control signal TMSPCC, a repair analyzer enable signal RAen, and an output signal of spare preamplifier SPK is provided. An output signal of AND circuit 125 is supplied to spare latch circuit SRLFK.

Repair analyzer enable signal RAen is set to the H level when repair determination (whether a defect can be repaired or not is determined and a defective address is specified) is made by the repair analyzer (RA) included in the built-in self-test (BIST) circuit. In the case of performing a test of the DRAM core by using the BIST circuit, repair analyzer enable signal RAen is set to the H level. In the case of performing the determining operation on test data by using the test interface circuit, the repair analyzer enable signal RAen is set to the L level. Test mode spare control signal TMSPCC is set to the H level in the test mode in which a test is preformed simultaneously on the spare memory cell and the normal memory cell.

To multiplexers MX1 to MX31 provided for preamplifiers PK1 to PK31, spare selection signals SPSEL1 to SPSEL31 from an AND circuit 127 for receiving test mode spare control signal ZTMSPCC and spare address signals SPADD1 to SPADD31 are supplied, respectively.

To multiplexer MX0 provided for preamplifier PK0, a spare selection signal SPSEL0 output from a composite gate 130 for receiving a complementary repair analyzer enable signal ZRAen, test mode spare control signal TMSPCC, and spare address SPADD0 is supplied. Composite gate 130 equivalently includes an AND circuit for receiving complementary repair analyzer enable signal ZRAen and test mode spare control signal TMSPCC, and an OR circuit for receiving an output signal of the AND circuit and spare address signal SPADD0.

The other configuration of read data path 20 is the same as that of the read data path according to the first embodiment of FIG. 7, and the corresponding components are designated by the same reference numerals and their detailed description will not be repeated.

In the case of performing a test on spare memory cell in a test of detecting a defective bit, test mode spare control signal TMCPCC is set to the H level, and complementary test mode spare control signal ZTMSPCC is set to the L level. In this state, therefore, multiplexers MX1 to MX31 select output signals of corresponding preamplifiers PK1 to PK31, and supply the selected signals to latch circuits RLFK1 to RLFK31 at the next stage.

On the other hand, in the case where repair analyzer enable signal RAen is set to the L level in a state where test mode spare control signal TMSPCC is at the H level to indicate that a test on spare memory cells (spare column) is to be performed, an output signal of AND circuit 125 is fixed to the L level, and an output signal of spare preamplifier SPK is not transmitted to latch circuit SRLFK.

On the other hand, in composite gate 130, complementary repair analyzer enable signal ZRAen is at the H level and test mode spare control signal TMSPCC is at the H level, so that spare selection signal SPSEL0 goes high, and multiplexer MX0 selects an output signal of spare pre-amplifier SPK and transmits it to latch circuit RLFK0. When repair analyzer enable signal RAen is set to the L level, therefore, a data bit from the spare memory cell (spare column) is output as an output data bit Dout0 which is transmitted to the tester. When the repair analyzer in the BIST circuit is not used in a test on the spare column (spare memory cells) and the determining operation is performed by the read data determining circuit in the test interface circuit, the data bit from the spare memory cell is transmitted to tester (read data determining circuit) 120 in the test interface circuit via latch circuits RFK0 and RLK0 and data output terminal 22r. In this case, therefore, the determining operation is performed in the test interface circuit, spare memory cell read data SPDout is not transmitted from spare data terminal 22s to the tester.

On the other hand, when repair analyzer enable signal RAen is set to the H level, complementary analyzer enable signal ZRAen is at the L level. Therefore, spare selection signal SPSEL0 output from composite gate 130 goes low (spare address signal SPADD0 is at the L level before a defective address is programmed), and multiplexer MX0 selects an output signal of preamplifier PK0. Similarly, AND circuit 125 is enabled to transmit an output signal of spare preamplifier SPK to latch circuit SRLFK. In this case, therefore, data bits Dout0 to Dout31 and spare data bit SPDout to be transmitted to data output terminal 22r and spare data output terminal 22s via latch circuits RLK0 to RLK31 and SRLFK are supplied in parallel to tester 120. In this case, tester 120 is a built-in self-test circuit (BIST circuit), determines the position of a defective bit on the basis of a transmitted data bits from the internal repair analyzer (RA circuit) to determine the possibility of repairing and specify the defective address.

In the normal operation mode, test mode spare control signal TMSPCC is at the L level and complementary test mode spare control signal ZTMSPCC is at the H level. An output signal of AND circuit 125 is fixed to the L level, and AND circuit 127 operates as a buffer circuit to generate spare selection signals SPSEL1 to SPSEL31 in accordance with spare address signals SPADD1 to SPADD31. Similarly, in composite gate 130, even when complementary repair analyzer enable signal ZRAen is at the H level, test mode spare control signal TMSPCC is at the L level. Consequently, spare selection signal SPSEL0 is generated according to the spare address signal SPADD0. In this case, therefore, an output signal of spare pre-amplifier SPK is selected according to spare selection signals SPSEL0 to SPSEL31, and a global data line pair corresponding to the defective bit is replaced. When no defective bit exists, the replacement is not performed.

By using repair analyzer enable signal RAen and complementary repair analyzer enable signal ZRAen as shown in FIG. 17, in any of cases where tester 120 has the configuration in which only determination of read data is performed in the test interface circuit but repair determination is not performed and tester 120 has the configuration of performing the repair determination (specification of a defective address) on the basis of the result of determination according to the configuration of the tester such as a built-in self-test circuit, data of the memory cells (normal and spare memory cells) can be efficiently transmitted to the tester. In the write data path, in both of the case where the repair analyzer of the built-in self-test circuit is used and the case where the test interface circuit is used, data is generated simultaneously for the normal and spare memory cells, and test data is written.

In the configuration shown in FIG. 17, composite gate 130 may be formed into the configuration in which an output signal of an AND circuit for receiving spare address signal SPADD0 and complementary test mode spare control signal ZTMSPCC is supplied to the internal OR circuit, in place of the spare address signal SPADD0.

In read data path 20 shown in FIG. 17 as well, spare latch circuits SRLFK and SRLK can be constructed to perform a latching operation when test mode spare control signal TMSPCC is at the H level. It is not particularly necessary to provide AND circuit 127 when all spare address signals SPADD1 to SPADD31 are fixed to the L level before programming a defective address in the defect detecting operation. Spare selection signals SPSEL1 to SPSEL31 may be generated according to spare address signals SPADD1 to SPADD31.

In the above description, both the built-in self-test circuit and the test interface circuit are used. In the system LSI, however, only one of the test interface circuit and the built-in self-test circuit may be disposed.

When built-in self-test (BIST) circuit or test interface circuit (TIC) is alternatively used, the voltage level of repair analyzer enable signal RAen may be set fixedly by mask interconnection or the like in accordance with the use. When both the BIST circuit and test interface circuit (TIC) are used, it is sufficient to set repair analyzer enable signal RAen to the L level as a default and to set repair analyzer enable signal RAen to the H level when BIST circuit performs a test.

As described above, according to the second embodiment of the invention, spare memory cell data is selectively output to the spare data output terminal or normal memory cell data terminal in accordance with the contents of the test of the tester. Memory cell data to be tested can be efficiently read out in accordance with the configuration of the tester, for carrying out a test.

Other Embodiments

In the above description, an embedded DRAM formed with a logic on the same semiconductor chip is shown. As long as a semiconductor memory device repairs a defective column on an internal data line pair GIO unit, the present invention can be applied to any memory device.

The present invention can be also applied to a DDR (Double Data Rate) DRAM in which data is input/output synchronously with both the rising and falling edges of a clock signal. The present invention can be also readily applied to a DDR DRAM, with the configuration in which, as data an input/output latch circuit, a latch circuit for transferring data at the rising edge of a clock signal and a latch circuit for transferring data at the falling edge of the dock signal are provided in parallel with each other and are alternately made activate.

The global data line pair transfers both internal write data and internal read data. The present invention can be also applied to the configuration in which the write global data line pair for transferring internal write data and the read global data line pair for transferring internal read data are separately provided as the global data line pair.

As described above, according to the present invention, by providing the data input/output terminal dedicated to spare memory cells, test can be simultaneously performed on the normal and spare memory cells, so that the test time can be shortened. Also in the case where the number of internal data line pairs (GIO) is large as in an embedded DRAM, by connecting the built-in self-test (BIST) circuit and the data input/output terminals dedicated to spare memory cells, similarly, the test time can be shortened. In the case of using the test interface circuit, test data can be written simultaneously on the normal and spare memory cells, so that the test data write time can be shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a normal array having normal memory cells arranged in rows and columns and divided into column blocks in a unit of a predetermined number of columns;
   a spare array having spare memory cells arranged in rows and columns, for repairing a defective cell in said normal memory cells by replacement;
   a plurality of normal internal data lines, disposed in correspondence with said column blocks, each coupled to a selected column of a corresponding column block;
   a spare internal data line disposed in correspondence with said spare array and coupled to a selected column of said spare array;
   a plurality of normal data terminals disposed in correspondence with said plurality of normal internal data lines, for receiving external data;
   a spare data terminal disposed in correspondence with said spare internal data line, for receiving external data; and
   test control circuitry for electrically coupling said plurality of normal data terminals and said plurality of normal internal data lines and for electrically coupling said spare internal data line and said spare data terminal in response to a test mode instruction signal.

2. The semiconductor memory device according to claim 1, wherein said test control circuitry includes:
   a replacement circuit for replacing said spare internal data line with an internal data line of the normal internal data lines in accordance with a defect address when said test mode instruction signal is made inactive; and
   a circuit for inhibiting the replacing operation of said replacement circuit when said test mode instruction signal is made active.

3. The semiconductor memory device according to claim 1, wherein said test control circuitry includes a circuit for transmitting data read onto said spare internal data line to either of said spare data terminal and a specific normal data terminal in said plurality of normal data terminals in response to a specific operation mode instruction signal when said test mode instruction signal is made active.

4. The semiconductor memory device according to claim 1, wherein
   each of the normal internal data lines is selectively coupled electrically to a write data line for transmitting write data and a read data line for transmitting read data in accordance with a write/read instruction signal, and
   said spare internal data line is selectively coupled electrically to a spare read data line for transmitting spare read data and a spare write data line for transmitting spare write data in accordance with said test mode instruction signal and said write/read instruction signal,
   said semiconductor memory device further comprises a selection circuit for selectively coupling said internal write data line and said internal read data line to said normal data terminal and for selectively coupling said spare read internal data line and said spare internal write data line to said spare data terminal in response to said write/read instruction signal, and
   the normal data terminals function as data input/output terminals and said spare data terminal functions as a spare data input/output terminal.

5. The semiconductor memory device according to claim 1, further comprising memory cell selection circuitry for simultaneously selecting memory cells in both said spare array and said normal array.

6. An semiconductor integrated device, comprising:
   a memory including (a) a memory array having a plurality of memory cells arranged in rows and columns and divided into a plurality of column blocks each including a predetermined columns of the memory cells, said column blocks including normal column blocks for storing data to be accessed and a spare column block for repairing a defective column in said normal column blocks, (b) normal data lines provided corresponding to the respective normal column blocks for communicating data with selected memory cells in corresponding column clocks, (c) a spare data line provided corresponding to said spare column block for communicating data with a selected memory cell in said spare column block, (d) a plurality of normal data nodes provided corresponding to the respective normal column blocks, (e) a spare data node provided corresponding to said spare column block, (f) selection circuitry responsive to a defect address signal indicating a defect column block for electrically coupling a normal data node provided corresponding to a normal column block to said spare data line in a normal mode of operation and coupling the normal data nodes to the respective column blocks and the spare data node to said spare column block in a test mode of operation; and
   test circuitry formed on a common chip with said memory and coupled to said memory in said test mode of operation and communicating data with said memory.

7. The semiconductor integrated circuit device according to claim 6, wherein the normal data nodes comprise normal data output nodes provided corresponding to said normal column blocks, and said spare data node comprises a spare data output nodes, and
   said selection circuitry includes;
   multiplexers provided corresponding to the respective normal column blocks and responsive to said defect address signal for selecting either of corresponding normal data lines and said spare data line for electrical connection to corresponding normal data nodes in said normal mode of operation,
   a gate circuit for electrically coupling said spare data line to said spare data node in said test mode of operation, and
   a control gate responsive to a test mode instructing signal instructing said test mode of operation for invalidating said defect address signal to indicate no defective normal column block and enabling said gate circuit in said test mode of operation.

8. The semiconductor integrated circuit device according to claim 6, wherein said normal data nodes comprise normal data input nodes provided corresponding to said normal column blocks and a spare data input node provided for said spare column block, and said selection circuitry includes;
- a first selection circuit responsive to said defect address signal for selecting a normal data input node provided corresponding to a normal column block designated by said defect address signal, and
- a second selection circuit responsive to a test mode instructing signal for instructing said test mode of operation, for selecting one of an output of said first selection circuit and a data on said spare data input node.

9. The semiconductor integrated circuit device according to claim 6, wherein the normal data nodes comprise normal data output nodes provided corresponding to said normal column blocks, and said spare data node comprises a spare data output nodes, and said selection circuitry includes;
- a first multiplexer provided for a predetermined normal column block and responsive to a first selection signal generated from said defect address signal for selecting either of data on said spare data line and data on a corresponding data line for transmission to a corresponding normal data output node,
- second multiplexers provided corresponding to the normal column blocks other than said predetermined normal column block and responsive to second selection signals generated from said defect address signal for selecting either of data on corresponding normal data lines and data on said spare data line for electrical connection to corresponding normal data output nodes in said normal mode of operation,
- a gate circuit for electrically coupling said spare data line to said spare data node in a first mode of operation in said test mode of operation I response to a test mode instructing signal instructing said test mode of operation and a first mode designating signal designating said first mode of operation,
- a first control gate responsive to the first test mode instructing signal for invalidating said second selection signals to indicate no defective normal column block, and
- a second control gate responsive to said first test mode instructing signal and said first mode designating signal, for invalidating said first selection signal in said first mode of operation in said test mode of operation to couple the normal data line corresponding to the predetermined normal column block to the corresponding normal output node and for validating said first selection signal in a second operation mode in said test mode of operation to couple the spare data line to the corresponding data output node.

10. The semiconductor integrated circuit device according to claim 6, wherein said test circuitry includes a determination circuit for determining whether data received from the memory include a defective bit.

11. The semiconductor integrated circuit device according to claim 6, wherein said test circuitry comprises a built in self test circuit for testing said memory in accordance with a pre-stored test program.

12. The semiconductor integrated circuit device according to claim 6, wherein said test circuitry comprises a test interface circuit for allowing an external tester to access to said memory.

* * * * *